US010346761B2

(12) United States Patent
Clarke et al.

(10) Patent No.: US 10,346,761 B2
(45) Date of Patent: Jul. 9, 2019

(54) ADIABATIC PHASE GATES IN PARITY-BASED QUANTUM COMPUTERS

(71) Applicant: Microsoft Technology Licensing, LLC, Redmond, WA (US)

(72) Inventors: David Clarke, College Park, MD (US); Jay Deep Sau, Rockville, MD (US); Sankar Das Sarma, College Park, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/172,439

(22) Filed: Oct. 26, 2018

(65) Prior Publication Data
US 2019/0065982 A1 Feb. 28, 2019

Related U.S. Application Data

(62) Division of application No. 15/199,582, filed on Jun. 30, 2016, now Pat. No. 10,133,984.

(60) Provisional application No. 62/235,028, filed on Sep. 30, 2015.

(51) Int. Cl.
*G06N 10/00* (2019.01)
*G06F 15/82* (2006.01)
*H01L 49/00* (2006.01)

(52) U.S. Cl.
CPC .......... *G06N 10/00* (2019.01); *G06F 15/82* (2013.01); *H01L 49/006* (2013.01)

(58) Field of Classification Search
CPC ...... G06N 99/002; G06F 15/82; H01L 49/006
USPC .......................................................... 706/62
See application file for complete search history.

(56) References Cited

U.S. PATENT DOCUMENTS

2014/0221059 A1* 8/2014 Freedman ............ G06N 99/002
455/899

* cited by examiner

*Primary Examiner* — Harry W Byrne
(74) *Attorney, Agent, or Firm* — Klarquist Sparkman, LLP

(57) ABSTRACT

Example methods and mechanisms are described herein for implementing and adiabatically operating a topological quantum computing (TQC) phase gate that complements the existing Clifford operations, and thereby allows universal quantum computation with Majorana systems. Further embodiments include a testing system for the phase gate that is feasible with Majorana zero modes and demonstrates violations of the CHSH-Bell inequality. Further, the design used for the testing of the inequality leads directly to a practical platform for performing universal TQC with Majorana wires in which explicit braiding need never occur. Thus, certain embodiments of the disclosed technology involve three synergistically connected aspects of anyonic TQC (in the context of the currently active area of using MZMs for topological quantum computation): a practical phase gate for universal topological quantum computation using MZMs, a precise protocol (using CHSH inequality) for testing that the desired gate operation has been achieved, and bypassing the necessity of MZM braiding (and so avoiding, e.g., problems of nonadiabaticity in the braids).

13 Claims, 15 Drawing Sheets

ADIABATIC PHASE GATES IN PARITY-BASED QUANTUM COMPUTERS

CROSS-REFERENCE TO RELATED APPLICATIONS

This application is a divisional of U.S. application Ser. No. 15/199,582, filed Jun. 30, 2016, and entitled "ADIABATIC PHASE GATES IN PARITY-BASED QUANTUM COMPUTERS", which claims the benefit of U.S. Provisional Application No. 62/235,028, filed Sep. 30, 2015, and entitled "ADIABATIC PHASE GATES IN PARITY-BASED QUANTUM COMPUTERS", which are hereby incorporated herein in their entirety.

FIELD

This application relates to reversible computing, such as quantum computing. In particular, this application discloses embodiments for phase gates for use in a quantum circuit.

BACKGROUND

Carrying out fault-tolerant topological quantum computation using non-Abelian anyons (e.g., Majorana zero modes) is a desired goal in quantum computation. However, the Gottesman-Knill theorem holds that if a system can only perform a certain subset of available quantum operations (e.g., operations from the Clifford group) in addition to the preparation and detection of qubit states in the computational basis, then that system is insufficient for universal quantum computation. Indeed, any measurement results in such a system could be reproduced within a local hidden variable theory, so that there is no need for a quantum mechanical explanation and therefore no possibility of quantum speedup.

Unfortunately, Clifford operations are precisely the ones available through braiding and measurement in systems supporting non-Abelian Majorana zero modes, which are otherwise a suitable candidate for topologically protected quantum computation. In order to move beyond the classically simulable subspace, an additional phase gate is desired. This phase gate would allow the system to violate the Bell-like CHSH inequality that would otherwise constrain a local hidden variable theory.

SUMMARY

Disclosed herein are representative embodiments of methods, apparatus, and systems for quantum computing, and in particular for quantum computing using a universal topological quantum computer. The disclosed methods, apparatus, and systems should not be construed as limiting in any way.

In this disclosure, a new type of phase gate is introduced for already existing semiconductor-based Majorana wire systems. Additionally, embodiments disclosed herein demonstrate how this phase gate may be benchmarked using CHSH measurements.

In particular embodiments, systems and techniques are disclosed that use a "measurement-only" approach that bypasses the need for explicit Majorana braiding. This approach may be scaled beyond the two-qubit system used for CHSH violations, leading to a well-defined platform for universal fault-tolerant quantum computation using Majorana zero modes.

Certain example embodiments concern a method for operating an adjustable phase gate in a quantum circuit, the adjustable phase gate comprising a stationary pair of Ising anyons. Example implementations comprise the acts of causing a mobile Ising anyon to pass through the adjustable phase gate, thereby creating a targeted phase change in the stationary pair of Ising anyons; and controlling the mobile Ising anyon as the mobile Ising anyon passes through the adjustable phase gate so that the mobile Ising anyon has a complex amplitude during passage. Further, the controlling is performed such that the targeted phase change experienced by the stationary pair of Ising anyons is between 0 and $\pi$ or 0 and $-\pi$. In particular implementations, the controlling comprises performing one or more of: (a) adjusting a gate voltage of one or more gates capacitively coupled to one or more superconducting islands that form the adjustable phase gate, (b) adjusting a capacitance of the one or more superconducting islands; or (c) adjusting a strength of at least one Josephson junction relative to at least one other Josephson junction, the Josephson junctions connecting two or more of the superconducting islands to one another. In some implementations, the method further comprises, in a first operational stage, altering a magnetic flux through the adjustable phase gate in a first direction, the first direction comprising either increasing the magnetic flux or decreasing the magnetic flux; and, in a second operational stage, altering the magnetic flux through the adjustable phase gate in a second direction that is opposite of the first direction. Further, in some examples, during either or both operational stages, the method can comprises adjusting a strength of a first Josephson junction at a first end of a superconducting region in the adjustable phase gate; and, during either or both operational stages, adjusting a strength of a second Josephson junction at a second end of the superconducting region in the adjustable phase gate, wherein the strengths of the first and second Josephson junctions are selected to create a relative difference that produces the targeted phase change in the Ising pair. In some examples, the adjustable phase gate comprises a plurality of superconducting regions arranged to form a superconducting loop, wherein adjacent ones of the superconducting regions are connected to one another via respective Josephson junctions, and herein one of the superconducting regions comprises a Majorana wire located on the one of the superconducting regions. In certain example embodiments, the adjustable phase gate is implemented in a transmission line resonator comprising three Majorana wires arranged to form a qubit between a bus and a phase ground of the transmission line resonator. In some example embodiments, the method further comprises measuring one or more Pauli operators of the qubit by selectively controlling: (a) Josephson couplings between a first superconducting region on which a first Majorana wire is located and a bus and phase ground; and (b) Josephson couplings between a second superconducting region on which a second Majorana wire is located and the bus and the phase ground. In some example embodiments, the superconducting loop that is desirable for the phase gate is formed by the second superconducting region, the phase ground, and a third superconducting region containing no Majorana wire.

Further example quantum circuit phase gates disclosed herein comprise: a plurality of superconducting components arranged in a ring to form a superconducting loop, wherein adjacent superconducting components are connected to each other via Josephson junctions; a Majorana wire located on a respective one of the superconducting components; and a magnetic field generator configured to apply a variable magnetic field to the superconducting loop formed by the ring of superconductive components. In some implementations, the magnetic field generator and the capacitance of one or more of the superconducting components are controllable to draw a Josephson vortex into the superconducting loop. Further, in certain examples, the superconducting components comprise first and second superconducting islands connected to a bulk superconductor. In some implementations, for example, the first superconducting island is connected to the bulk superconductor via a first controllable Josephson junction, the second superconducting island is connected to the bulk superconductor via a second controllable Josephson junction, and the first superconducting island is connected to the second superconducting island via a third Josephson junction. In certain examples, only the first and second Josephson junctions are controllable. Still further, the phase gate can be part of a greater system. For instance, in some example embodiments disclosed herein, a microwave resonator system configured to implement a qubit register between a bus and a phase ground is disclosed, the qubit register comprising the phase gate as described above. In some implementations of such systems, the Majorana wire is a first Majorana wire, and the plurality of superconducting components arranged in a ring comprises: a first superconducting component coupled to the phase ground via a first controllable Josephson junction and coupled to the bus via a second controllable Josephson junction, the first Majorana wire being located on the first superconducting component; and a second superconducting component coupled to the phase ground via a third controllable Josephson junction and coupled to the first superconducting component via a fixed Josephson junction, the second superconducting component being disconnected from the bus. In some examples, the microwave resonator further comprises: a third superconducting component coupled to the phase ground via a fifth controllable Josephson junction and to the bus via a sixth controllable Josephson junction; a second Majorana wire located on the third superconducting component; a third Majorana wire located on a superconducting component connected to the bus, the first, second, and third Majorana wires being positioned to create the qubit register with no braiding mechanism. In some examples, a Clauser-Horne-Shimony-Holt (CHSH) inequality or Bell inequality measurement system is disclosed, in which the system comprises the phase gate as described here.

In some example embodiments, methods of operating a quantum circuit phase gate are disclosed in which the method comprises: applying a time-varying magnetic field to a set of regions in the quantum circuit phase gate, at least some of the regions being connected to one another via respective Josephson junctions; and controlling a first of the Josephson junctions and a second of the Josephson junctions to create a Josephson vortex in the quantum circuit phase gate as the time varying magnetic field is applied. In some implementations, the regions are superconducting regions, and the regions form a superconducting loop. In certain implementations, the Josephson vortex produces a phase change to a qubit stored in a qubit register formed with the quantum circuit phase gate. In some implementations, the method comprises selectively varying the phase change between 0 and π or 0 and -π.

The foregoing and other objects, features, and advantages of the invention will become more apparent from the following detailed description, which proceeds with reference to the accompanying figures.

DETAILED DESCRIPTION

I. General Considerations

Figure 1:
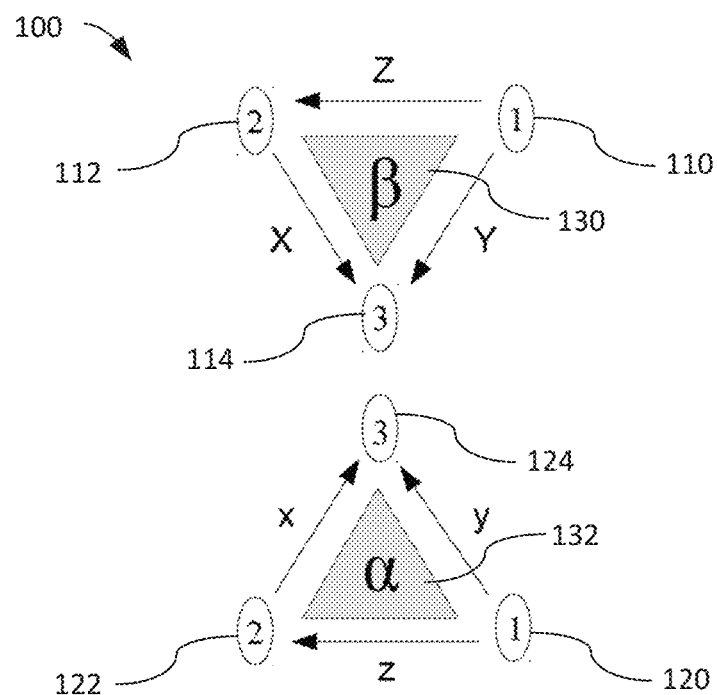
FIG. 1 is a schematic block diagram that shows shows six Majorana zero modes (MZMs).

Disclosed herein are representative embodiments of methods, apparatus, and systems for quantum computing, and in particular for quantum computing using a universal topological quantum computer. The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any features or aspects of the disclosed embodiments can be used alone or in various combinations and subcombinations with one another. For example, one or more method acts from one embodiment can be used with one or more method acts from another embodiment and vice versa. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Various alternatives to the examples described herein are possible. For example, some of the methods described herein can be altered by changing the ordering of the method acts described, by splitting, repeating, or omitting certain method acts, etc. The various aspects of the disclosed technology can be used in combination or separately. Different embodiments use one or more of the described innovations. Some of the innovations described herein address one or more of the problems noted herein. Typically, a given technique/tool does not solve all such problems.

As used in this application and in the claims, the singular forms "a," "an," and "the" include the plural forms unless the context clearly dictates otherwise. Additionally, the term "includes" means "comprises." Further, as used herein, the term "and/or" means any one item or combination of any items in the phrase.

II. Introduction to Disclosed Technology

Implementing fault-tolerant quantum computation using physical qubits is a goal for developers of quantum computers. Unique among such efforts is so-called topological quantum computation ("TQC"), which utilizes exotic non-Abelian quasiparticles in storing the qubits. These anyons, the most prominent examples of which are zero-energy localized excitations (called "Majorana zero modes") in the superconducting gaps of certain types of topological superconductors, are neither fermions nor bosons, obeying instead a non-Abelian statistics in two-dimensional systems. As nonlocal topological objects, these anyonic quasiparticles are immune to local perturbations in the system, and thus have the characteristic property of having little or no quantum decoherence, making them desirable from the perspective of quantum computation.

Disclosed herein are embodiments for addressing a current roadblock in carrying out anyonic TQC by providing mechanisms and methods for carrying out universal quantum computation using Majorana qubits. Also disclosed are mechanisms and methods for connecting the anyonic TQC with fundamental aspects of quantum nonlocality through the observation of a particular variant of the Bell inequality using Majorana zero modes as a clear signal of the universality of the underlying topological quantum computing platform.

Universal quantum computation involves the operator having the ability to produce any quantum state in the computational Hilbert space, including in particular those that violate the limits imposed on local hidden variable theories by the Bell inequality or its variants such as the Clauser-Horne-Shimony-Holt ("CHSH") inequality. Even with the aid of measurement, however, a topological quantum computer based on the braiding of anyonic Majorana fermion zero modes ("MZMs") cannot create such a state in a topologically protected manner. This is related to the fact that the braids and measurements of MZMs together form a representation of the Clifford group, which is classically simulable. This limitation of MZMs in carrying out universal quantum computation arises from the Ising (or $SU(2)_2$) nature of the corresponding topological quantum field theory ("TQFT") which enables only $\pi/2$ rotations in the Hilbert space of the qubits through braiding. (The surface code implementation in superconducting qubits, which is one of the most promising practical approaches to quantum computation at the present time, also suffers from the limitation of only supporting Clifford group operations in a natural way.)

While there are many theoretical proposals for going beyond MZMs (e.g., beyond the Ising anyon universality) which, in principle, could lead to universal topological quantum computation by utilizing richer TQFT (e.g. $SU(2)_3$ or Fibonacci anyons), no such system has been experimentally demonstrated. Furthermore, these richer systems enabling universal TQC often require extremely complicated braiding operations involving very high overhead in order to approximate Clifford group operations, which themselves are useful for quantum error correcting codes.

It is therefore desirable to develop quantum computing approaches that specifically use MZMs (potentially some additional operations) to carry out inherently quantum-mechanical tasks beyond the constraint of the Gottesman-Knill theorem. In particular, it has been observed that the "protected" operations of braiding and measurement on MZMs (and also the surface code) become universal for quantum computation when supplemented with a single qubit phase gate of small enough angle. The so-called $\pi/8$ phase gate (or T gate) $e^{-i\pi/8}|0\rangle\langle 0|+e^{i\pi/8}|1\rangle\langle 1|$ is often named as part of a universal gate set. In part, this is because of the "magic state distillation" protocol that corrects errors in noisy T gates through the use of Clifford gates and measurement. See S. Bravyi and A. Kitaev, Phys. Rev. A 71, 022316 (2005), quant-ph/0403025. However, any single qubit phase gate that produces a phase difference $\theta$ between be two qubit states with $\theta \neq n\pi/4$ for integer n is sufficient for universal quantum computation as long as it can be produced consistently. (In fact, it would be useful for the reduction of the overhead to be able to produce a phase gate of arbitrary angle, and there are now error correction algorithms designed with this in mind.)

In this disclosure, example methods and mechanisms are described for implementing and adiabatically performing the phase gate that complements the existing Clifford operations, and thereby allows universal quantum computation with Majorana systems. In order to test such a gate, a quantum demonstration feasible with MZMs, namely, violations of CHSH-Bell inequality, is also disclosed. Further, the design used for the testing of the inequality leads directly to a practical platform for performing universal TQC with Majorana wires in which explicit braiding need never occur. Thus, certain embodiments of the disclosed technology involve three synergistically connected aspects of anyonic TQC (in the context of the currently active area of using MZMs for topological quantum computation): a practical phase gate for universal topological quantum computation using MZMs, a precise protocol (using CHSH inequality) for testing that the desired gate operation has been achieved, and bypassing the necessity of MZM braiding (and so avoiding, for example, problems of nonadiabaticity in the braids). Any one or more of these developments can be used alone or in combination with one another.

In designing the phase gate and the quantum computation platform, example embodiments disclosed herein take a "black box" approach to the Majorana wire system itself, avoiding as much as possible the manipulation of parameters that might change the topological nature of the wire state, or tune couplings between the MZMs. This approach is advantageous due to the continuously-developing nature of the Majorana field. Particular embodiments focus on a universal aspect of the Majorana system: a well-developed degeneracy associated with the fermion parity of a given wire. This approach (based in "measurement-only" TQC) is entirely sufficient for producing and testing the adiabatic phase gate and (by extension) for universal quantum computation. See, e.g., P. Bonderson et al., Phys. Rev. Lett. 101, 010501 (2008), arXiv:0802.0279, and P. Bonderson et al., Annals of Physics 324, 787 (2009), arXiv:0808.1933.

In Section III below, the CHSH inequalities are reviewed in the context of Majorana zero mode physics. A measurement of violations of the CHSH-Bell inequalities is a useful step in demonstrating not only the fundamental quantum physics and non-Abelian statistics of Majorana zero modes, but also the departure from the Clifford group that is necessary for universal quantum computation. In particular, it has been shown that operations capable of producing a violation of the CHSH inequality, when combined with Clifford operations, are sufficient for universal quantum computation. This may be thought of as a refinement of the usual error-correction bound given by magic-state distillation. Put another way, if a phase gate produces a violation of the CHSH inequalities, then it falls within the error-correction bound. Thus, a CHSH measurement may be used as a single-number benchmark of the quality of a gate, rather than relying on tomography of the entire produced state.

In Sections IV-V, embodiments of a new type of phase gate are introduced and analyzed. Other proposals for introducing a single qubit phase gate into a Majorana-wire based system have been fundamentally limited by timing errors due to the largely unknown relaxation rates involved in the detailed wire physics. In certain embodiments of the disclosed technology, however, these limitations are bypassed by eliminating timing errors entirely, and instead performing (or operating) the phase gate adiabatically. In some example implementations, the disclosed phase gate uses elements such as semiconductor Majorana wires, superconductors, magnetic fields, and Josephson junctions and may be integrated into designs that use these elements for various other purposes (e.g., for braiding and Majorana-based memory) without much additional overhead. For example, embodiments of the disclosed phase gate can be integrated with designs such as those described in T. Hyart et al., Phys. Rev. B 88, 035121 (2013), 1303.4379. For this reason, certain example embodiments disclosed herein are designs that are appropriate for incorporation into such a system. However, these embodiments are not limiting, as the technology is adaptable for use in a variety of Majorana wire systems.

In Sec. VI below, example experimental setups for benchmarking the new phase gate using the CHSH inequalities are discussed. In contrast to various exotic proposals for going beyond MZMs and $SU(2)_2$ TQFT, certain example experimental setups disclosed herein do not require building new experimental platforms, but use already existing and extensively experimentally studied semiconductor nanowire-based MZM platforms. Further, the experiments discussed below establish the non-Abelian nature of the Majorana zero modes as well as test example embodiments of the disclosed phase gate. In some examples, measurement-based procedures directly equivalent to Majorana braiding are performed in the same architecture. In fact, embodiments of the disclosed system provide a simpler platform for effectively braiding with nanowire MZMs than other proposals in the sense that no coupling needs to be fine-tuned between the various Majorana modes.

In Sec. VII, example embodiments of a scalable memory register capable of measuring any Pauli operator on a set of qubits are described. The architecture of particular example implementations disclosed herein use only one junction of Majorana wires per qubit, greatly simplifying fabrication requirements for a Majorana-wire platform. Combined with the phase gate of Sec. IV, this design enables universal fault tolerant quantum computation using nanowire MZMs. Embodiments of the disclosed technology were designed with elements in mind that are available now, but the principles behind the disclosed phase gate and memory design examples are adaptable to any known or future Majorana wire system.

III. CHSH Inequalities

In this section, example device-independent aspects of embodiments of the disclosed technology are discussed. The example protocol described below to test the CHSH inequalities is independent of the particular platform used to realize MZMs (and as such transcends the specific Majorana wire system discussed herein). In order to test the inequality, and in one disclosed embodiment, six Majorana zero modes, the ability to do a pairwise measurement of adjacent Majorana modes, and a phase gate implemented on (a particular) two of the Majorana modes are used. The example procedure is as follows:

First, the six MZMs are divided into two sets of three. FIG. 1 is a block diagram 100 schematically showing the six Majorana zero modes (MZMs), labeled 110, 112, 114, 120, 122, 124, respectively. The MZMs in FIG. 1 are arranged in two qubits 130 and 132 comprising three MZMs each, with pairs corresponding to the x, y and z axis of each qubit labeled. An arrow designates the definition of the corresponding Pauli operator in terms of the MZMs. For example, $\sigma_z = i\alpha_1\alpha_2$, $\sigma_y = i\alpha_1\alpha_3$. Referring to FIG. 1, the Majorana fermion operators associated with the zero are labeled as modes $\alpha_i$ and $\beta_i$, where $i \in \{1, 2, 3\}$. The eigenvalues and commutation relations of the operators $i\alpha_i\alpha_j$ are such that one can make the identification $$\epsilon_{ijk}\alpha_i\alpha_j = 2\sigma_k^* \qquad (1)$$

where the $\sigma_k$ are Pauli matrices. The complex conjugation on the right hand side reverses the sign of $\sigma_2$ and ensures the correct commutation relations. In this way, one can identify the operators of three MZMs with those of a single spin-$\frac{1}{2}$, such that the pairwise measurement of the state of two of the three MZMs corresponds to projective measurement along the x, y, or z axis of the spin. In FIG. 1, these pseudospin axes are labeled as x, y, or z. Pauli matrices for the $\beta_i$ operators are labeled similarly but with the axes there labeled with capital letters X, Y, or Z.

The CHSH-Bell inequality (emph{see J. F. Clauser et al., Phys. Rev. Lett. 23, 880 (1969), URL http://link.aps.org/doi/10.1103/PhysRevLett.23.880) asserts that, in particular, $$|E(x,X) - E(x,Z) + E(z,X) + E(z,Z)| \leq 2 \qquad (2)$$

for a local hidden variable theory, where $E(a, B)$ indicates the expectation value of the operator $a \otimes B$. Local in this case means local to the qubits (here, the sets of three MZMs). The measurements made in this example are necessarily non-local in the individual MZMs themselves.

That said, and in accordance with embodiments of the disclosed technology, one can prepare a state that violates the CHSH inequality by first making initialization measurements that entangle the state of the two qubits. To this end, one can begin by measuring the operators $i\alpha_1\beta_1$ and $i\alpha_2\beta_2$, projecting both into their −1 eigenstates. (If the 'wrong' state is obtained, it may be corrected by measuring one MZM from the pair with one outside, then repeated until success.) This alone is not enough to violate the inequality, but only to saturate it. In spin language, in the z-basis, the operators are in the state $$\frac{1}{\sqrt{2}}|$$

$|\uparrow\uparrow\rangle + |\downarrow\downarrow\rangle$. One may easily check that the expectation value of $x \otimes X - x \otimes Z + z \otimes X + z \otimes Z$ for this state is indeed 2. In fact, any set of measurements (or braiding) performed on the MZMs can only saturate the classical bound, never exceed it (thus not manifesting quantum entanglement properties, as is consistent with the Gottesmann-Knill theorem). To violate the CHSH inequality, and in accordance with embodiments of the disclosed technology, one can add a phase gate (or equivalent) to the system. Applying this gate around, for example, the y-axis with an angle θ, it can be found that $$E(x,X)-E(x,Z)+E(z,X)+E(z,Z)=2\sqrt{2}\cos(2\theta-\pi/4) \quad (3)$$

Note that the phase gate that is available from braiding alone has $\theta=\pi/4$, and therefore can only saturate the classical bound indicated in Equation (2). A more finely resolved phase gate than is available from braiding is useful in order to violate the CHSH inequality. Example embodiments are described below for how this can be done in order to directly observe quantum entanglement properties through the violation of CHSH-Bell inequality in an MZM-based platform.

IV. Example Phase Gate Embodiments

In this disclosure, example embodiments of a new type of phase gate are described whose elements are native to the Majorana wire platform and which performs the phase rotation adiabatically so that precise timing is not a concern. In order to describe the new phase gate, consider first the following system: two Majorana zero modes (or Ising anyons) together form a two level system, which one may think of as the $\sigma_z$ component of a qubit. A third Ising anyon will pick up a topological component of phase $\pi(1-\sigma_z)/2$ upon going past this pair on one side (e.g., around the top (or bottom)), relative to the phase it picks up going around the opposite side (e.g., around the bottom (or top)), in addition to any Abelian phase.

Figure 2:
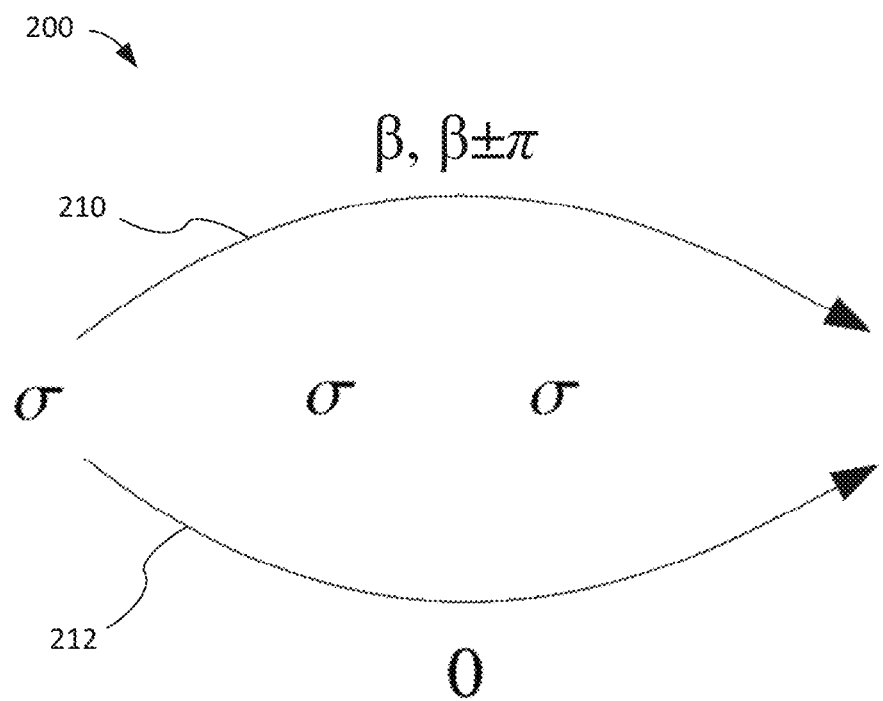
FIG. 2 is a schematic block diagram showing the phase gained by an example Ising anyon passing above or below a stationary Ising pair.

FIG. 2 is a schematic block diagram 200 illustrating this system and shows the phase gained by an example Ising anyon passing above (represented by top arrow 210) or below (represented by bottom arrow 212) a stationary Ising pair 220. (It is understood that the reference to "above", "below", "top", and "bottom" is for exemplary orientation purposes, and that the phase change example illustrated can occur in any desired orientation with equal effect.) The phase acquired is dependent on the combined state (qubit) stored by the two anyons. If the test particle passes entirely to one side of the pair, it acquires a topological phase of 0 or π (or −π) relative to passing on the other side in addition to the Abelian phase χ. Quantum effects, whereby the test particle has an amplitude to pass on either side and these paths interfere, can lead to more general (though unprotected) phases. The role of the test particle in particular implementations described herein is implemented by a Josephson vortex, while that of the stationary pair is held by a Majorana wire placed on a superconducting island. If instead of giving this particle a classical trajectory, it is allowed to behave quantum mechanically, then it now has some complex amplitude A (or B) for going above (or below) the qubit pair as it moves across the system (e.g., from left to right in FIG. 2, though it should be understood that this orientation is illustrative only). Referring to the orientation in FIG. 2, the total left-to-right amplitude is $A\sigma_z+B$. In the special case that the (Abelian) phases of A and B differ by χ=90°, the transmission probability is independent of the qubit state, and a phase gate $$U(A,B) = \frac{1}{\sqrt{|A|^2+|B|^2}}(|B|+i|A|\sigma_z) = e^{i\arctan\frac{|A|}{|B|}\sigma_z} \quad (4)$$

is applied to the qubit by the passage of the anyon.

Figure 3:
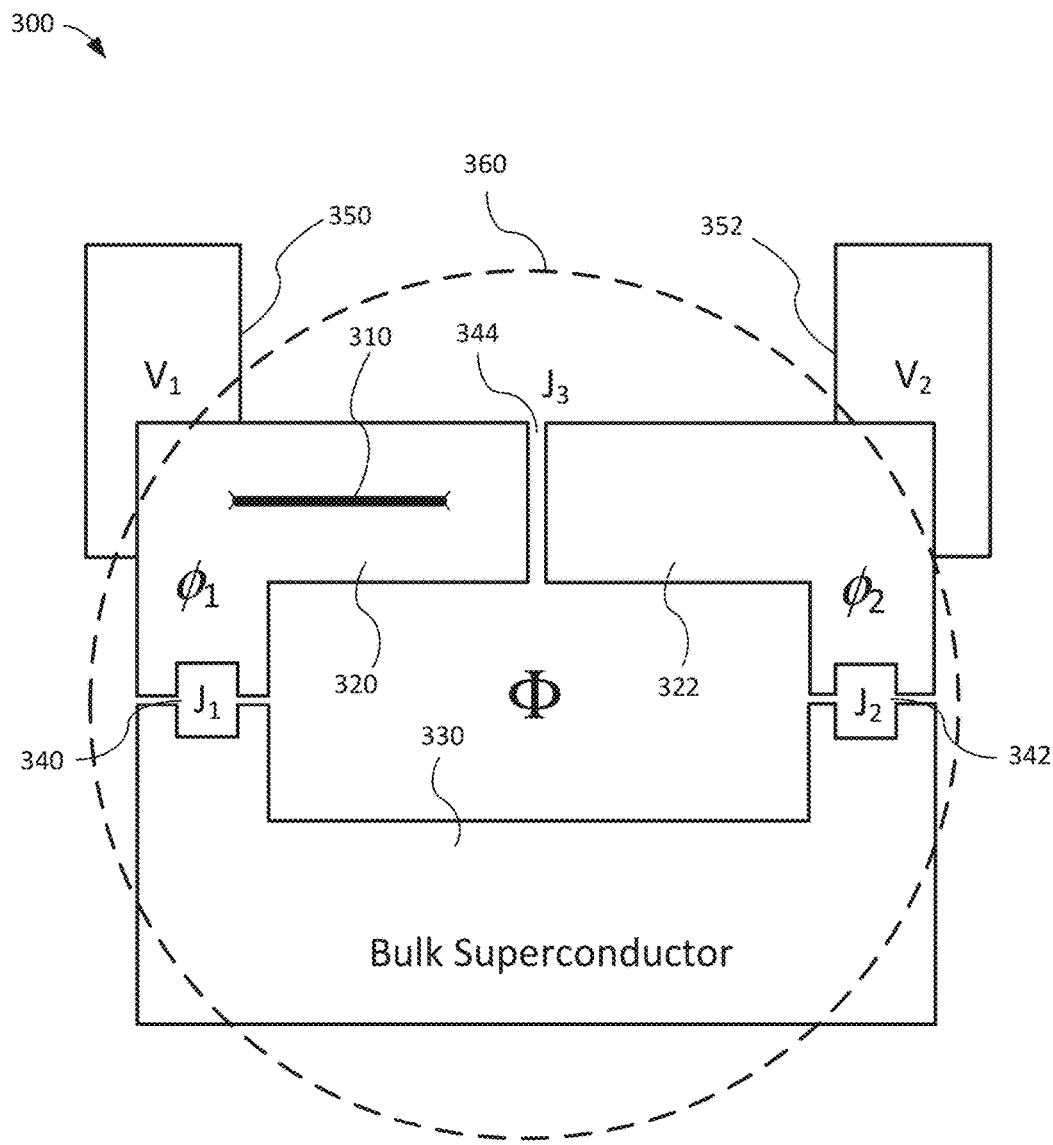
FIG. 3 is a schematic block diagram of an example embodiment of a phase gate in accordance with the disclosed technology.

FIG. 3 is a schematic block diagram of an example embodiment of a physical phase gate 300 in accordance with the disclosed technology. A Majorana nanowire 310 sits on the upper left of two superconducting islands 320, 322 connected to a bulk superconductor 330. (The superconducting regions 320, 322 are referred to as "islands" on account of their connection to the bulk superconductor 330 and each other through respective junctions (e.g., Josephson junctions)).

In the illustrated embodiments, Josephson junctions $J_1$ 340 and $J_2$ 342 are adjustable (e.g., using any controllable Josephson junction), while a Josephson junction $J_3$ 344 is strong and fixed. Gates of potential $V_1$ (gate 350) and $V_2$ (gate 352) are capacitively coupled to the superconducting islands 320, 322, respectively. In some example implementations, the gates 350 and 352 are nearby metallic probes that may be set to a given electric potential. It should be understood that the particular orientation of the Majorana nanowire 310 and the other components of the phase gate is by way of example only, as the phase gate can be rotated or the Majorana nanowire located on the opposite superconducting island, as desired for any particular implementation.

Operation of the exemplary phase gate 300 is performed by increasing (e.g., ramping up) (or decreasing (e.g., ramping down)) the magnetic flux in the superconducting loop (e.g., from $\Phi=0$ to $\Phi=2\pi$ (or from $\Phi=0$ to $\Phi=-2\pi$)) while the strengths of couplings $J_1$ and $J_2$ are comparable to draw a Josephson vortex into the loop through two interfering paths, then decreasing the flux (e.g., ramping the flux back down) to a lower value (e.g., zero) (or increasing the flux to a higher value ((e.g., zero) if the initial stage involved decreasing the magnetic flux) with $J_2 \gg J_1$ to release the vortex deterministically through the right junction.

The flux can be generated by an external magnetic field generator, such as a solenoid or coil shown schematically as magnetic flux generator 360. In FIG. 3, the magnetic flux generator 360 is shown in dashed lines to show an example position and orientation above or below the phase gate, though show arrangement is not limiting, as there exists a variety of different arrangements that can produce the desired flux and Josephson vortex in the phase gate. Further, for ease of illustration and to avoid obfuscation, many of the other figures in this disclosure do not show the magnetic flux generator, though the magnetic flux generator is understood to be present in such embodiments.

In certain implementations, the embodiment of FIG. 3 can be described as a ring of superconducting islands 320, 322, 330 connected by three Josephson junctions 340, 342, 344. In particular implementations, two of the Josephson junctions 340, 342, are adjustable, while the third 344 is assumed to be a much stronger link than the other two. One of these islands will hold a Majorana wire (e.g., of the type described by R. M. Lutchyn et al., Phys. Rev. Lett. 105, 077001 (2010), 1002.4033; Y. Oreg et al., Phys. Rev. Lett. 105, 177002 (2010), 1003.1145; and J. D. Sau et al., Phys. Rev. B 82, 214509 (2010), 1006.2829.

In the illustrated embodiment, the Majorana wire 310 is shown on island 320. The endpoints of this wire (e.g., wire 310) act as Majorana zero modes, and allow that island to contain either an even or odd number of electrons with no energy penalty. Here, the fermion parity (q={0, 1}) of this island is used as the axis of the qubit around which the rotation is performed. The role of the mobile Ising anyon in the embodiment above may then be implemented by a magnetic flux vortex traveling through the Josephson junctions to enter the ring. The topological component of the phase picked up when a flux encircles the Majorana wire is again $\pi(1-\sigma_z)/2$, now arising from the Aharanov-Casher effect. Finally, the example embodiment includes a capacitive coupling to an adjustable gate voltage by one or both of the superconducting islands. This is represented in the example embodiment by the "gate charge" vector $\vec{Q}=(C_{g1}V_{g1}C_2V_{g2})$ where $C_{gi}$ and $V_{gi}$ are, respectively, the capacitance and voltage of the gates on each island. Changing $\vec{Q}$ allows one to adjust the relative (Abelian) phase $\chi$ acquired by the flux as it moves through one or the other of the weak Josephson links.

In order to implement a phase gate in accordance with the disclosed technology, the external magnetic field (e.g., generated by a magnetic field generator, such as a solenoid or coil) is adjusted in order to adiabatically (e.g., slowly) increase the amount of magnetic flux running through the superconducting loop from 0 to $2\pi$. (Note that there is no precise constraint on the exact timing of the flux threading process as long as it is adiabatic.) This will deterministically draw a Josephson vortex into the loop through one of the weak links, but does not measure which path that vortex takes. This is an example of the anyon interferometer that produces the phase gate (see, e.g., P. Bonderson et al., ArXiv e-prints (2013), 1306.2379.)

It remains to determine the phase that is produced based on the physical parameters of the system. To do so, begin with the Lagrangian:

$$L = \frac{1}{2}\left(\frac{\Phi_0}{2\pi}\right)^2 \dot{\vec{\phi}} C \dot{\vec{\phi}}^T + \frac{\Phi_0}{2\pi}\dot{\vec{\phi}} \cdot \left(\vec{Q}^T + e\vec{q}^T\right) - V(\phi_1, \phi_2), \quad (5)$$

where $\vec{\phi} = (\phi_1 \; \phi_2)$, $C = \begin{pmatrix} C_1 & -C_3 \\ -C_3 & C_2 \end{pmatrix}$, and $$V(\phi_1, \phi_2) = -J_1\cos(\phi_1 - \Phi/2) - J_2\cos(\phi_2 + \Phi/2) - J_3\cos(\phi_1 - \phi_2). \quad (6)$$

Here $\vec{q}=(q0)$ is the fermion parity on the Majorana wire, the variable $\Phi$ is the flux through the superconducting ring, and $\dot{\phi}_i$ is the time derivative of the superconducting phase on island i. It will often be convenient to refer to the Josephson asymmetry $\in$, defined through $J_1=(1+\in)J$, $J_2=(1-\in)J$, and the unitless strength of the strong Josephson link $\lambda=J_3/J$.

To run (operate) the example phase gate, the value of $\Phi$ is adiabatically increased from 0 to $2\pi$ by applying an external magnetic field.

Figure 4:
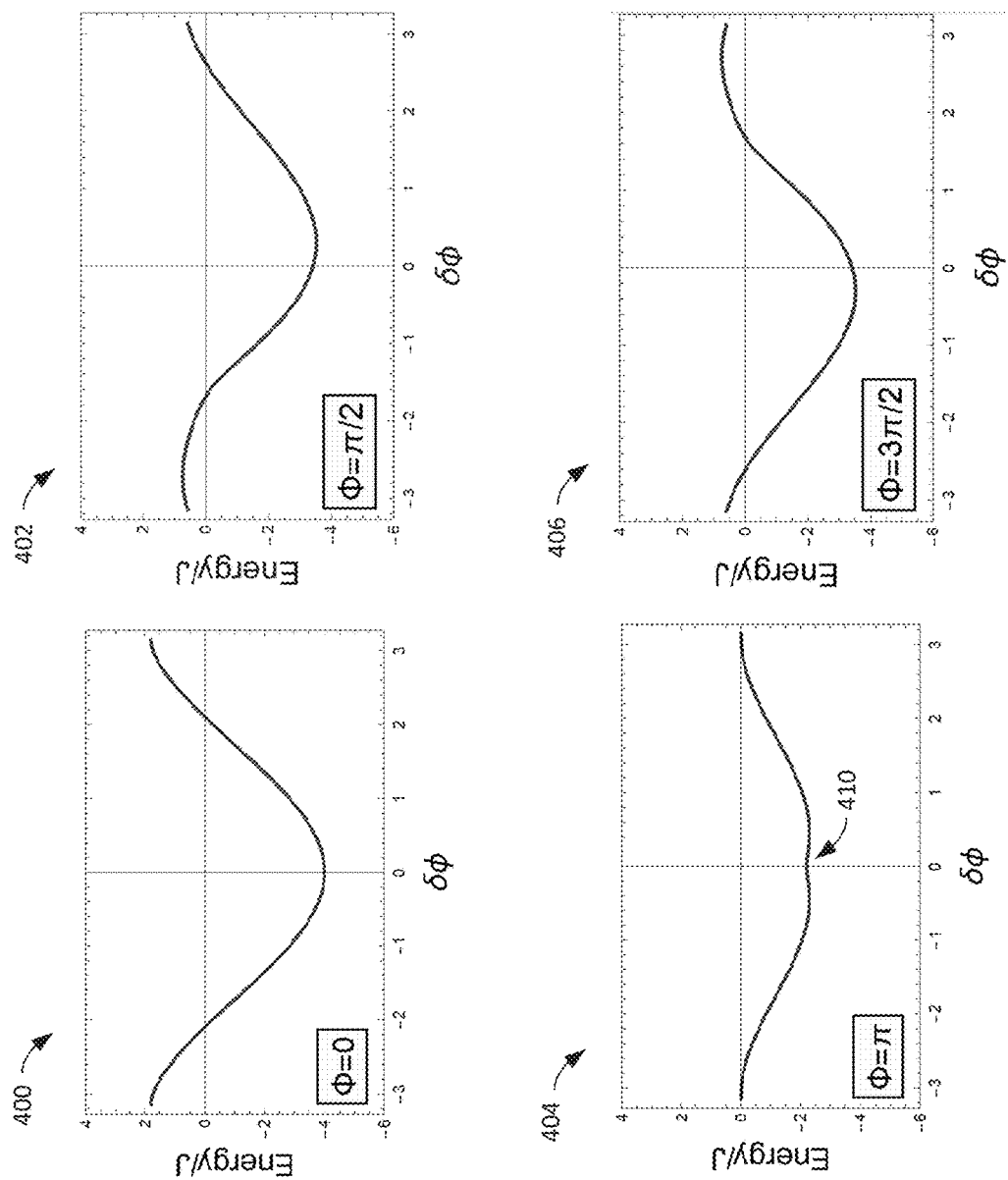
FIG. 4 is a series of graphs that indicate the potential energy vs. superconducting phase difference $\delta\phi=\phi_1-\phi_2$ plotted for example embodiments of the disclosed technology.

FIG. 4 shows graphs 400, 402, 404, 406 that illustrate the potential energy vs. the superconducting phase difference $\delta\phi=\phi_1-\phi_2$ (minimized over $\bar{\phi}=(\phi_1+\phi_2)/2$), plotted for a strong junction twice as strong as the average of the other two ($\lambda=2$) and a Josephson asymmetry $\in=0.1$, and various values of $\Phi$. (In the illustrated example, magnetic flux is first increased (from 0 to $2\pi$), but it should be understood that this is by way of example only; in other embodiments, the magnetic flux can first be decreased (from 0 to $-2\pi$).) As $\Phi$ is tuned from 0 to $2\pi$, a magnetic flux is drawn into the superconducting loop. Note the degeneracy at $\Phi=\pi$, shown generally at 410.

Figure 5:
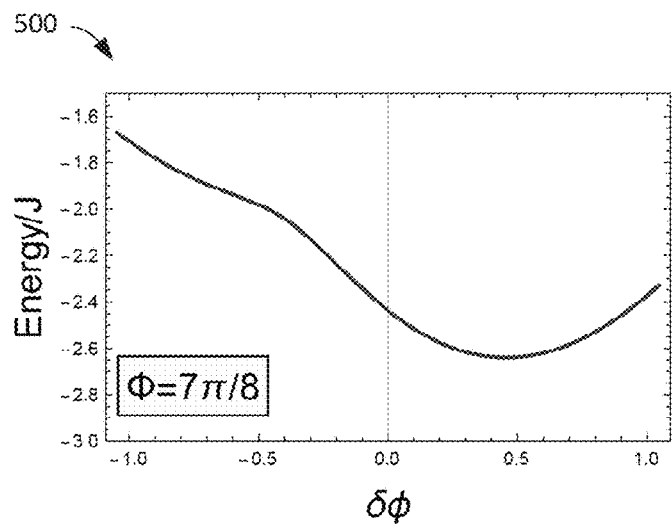
FIG. 5 shows is a series of graphs that indicate the potential energy vs. the superconducting phase difference $\delta\phi$ near the degeneracy point.
Figure 5:
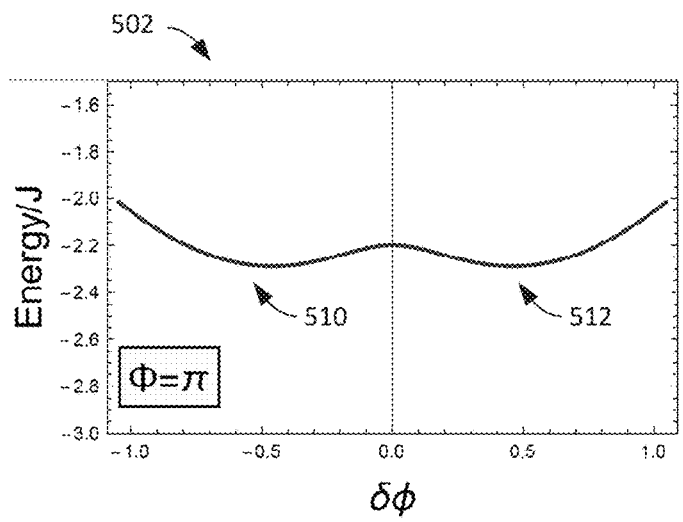
Figure 5:
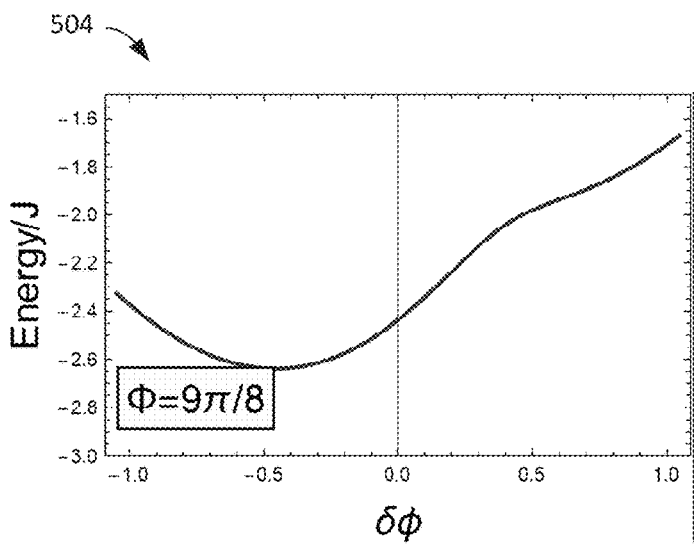

FIG. 5 includes graphs 500, 502, 504 that show the potential energy vs. the superconducting phase difference $\delta\phi$ (minimized over the superconducting phase $\bar{\phi}$) near the degeneracy point, plotted for a strong junction twice as strong as the average of the other two ($\lambda=2$) and a Josephson asymmetry $\in=0.1$. Note that two inequivalent minima (shown generally at 510, 512) develop when the flux from the external field $\Phi=\pi$, and an instanton event is required for the system to remain in the absolute minimum of energy as $\Phi$ is tuned past this point. This instanton may occur either with a forward or a backward jump in $\bar{\phi}$, and there is interference between the two paths.

Of particular note is the point $\Phi=\pi$, shown in graph 502, at which the system will need to cross a tunnel barrier to move from one degenerate minimum (the true minimum for $\Phi<\pi$) to the other (the true minimum for $\Phi>\pi$) (See FIG. 5). A system is considered for which:

$$J_3(J_1+J_2) \geq J_1 J_2 \geq J_3(J_1-J_2) \geq 0. \quad (7)$$

In terms of the unitless coupling constants $\in$ and $\lambda$, this condition may be expressed as:

$$2\lambda \geq 1 - \in^2 \geq 2\lambda\in \geq 0 \quad (8)$$

In such a system, the tunneling is well described by two interfering paths. Both paths will alter the phase difference $\delta\phi=\phi_1-\phi_2$ by the same amount. The paths differ by a full $2\pi$ winding of the average phase $\bar{\phi}=(\phi_1+\phi_2)/2$ of the superconducting islands. In Section X, the relative amplitude of these two paths is calculated in an instanton approximation. It has been found that the effective phase gate after adiabatic evolution of $\Phi$ is given by $$U(q)=\exp(i \; \text{Arg}(1+e^{i(S_+(q)-S_-(q))})), \quad (9)$$

where $S_+(q)-S_-(q)$ is the difference in instanton actions dependent on the qubit state q. It is calculated in Section X to be $$S_+(q) - S_-(q) = -i\Phi_0 \sqrt{\frac{J\eta}{2\tilde{C}}}(2\tilde{C}_\eta^\epsilon + \eta\tilde{C}) + O(\eta^{5/2}) + \Phi_0(Q_1+Q_2) + \pi q. \quad (10)$$

Here $\eta = \frac{1-\in^2}{2\lambda}$, $\bar{C}=C_1+C_2-2C_3$, and $\tilde{C}=C_1-C_2$.

Note that the phase gate given by Eq. (9) is gauge dependent. For particular nonlimiting example embodiments, a gauge is chosen in which tunneling a Josephson vortex through $J_1$ gives a $\pi$ phase difference (e.g., positive $\pi$ or negative $\pi$) between the two states of the qubit, while tunneling a vortex through $J_2$ does not measure the qubit charge. In order to get a gauge invariant quantity, one can reverse the described procedure to release the vortex from the superconducting loop by ramping down the magnetic field, this time with $J_2$ tuned to 0 so that the vortex has a guaranteed exit path.

The difference in instanton actions for the two entry paths takes the form $i(S_+ - S_-) = i\pi q + i\chi \cdot d$, where $\chi$ and $d$ are real numbers with $\chi = \Phi_0(Q_1 + Q_2)$ and $$d \approx \Phi_0 \sqrt{\frac{J\eta}{2\tilde{C}}}(2\tilde{C}_\eta^\epsilon + \eta \tilde{C}).$$

In these terms, the phase accumulated between the two qubit states is given by $$2\theta = \arg(\sinh(d) + i\sin(\chi)) \quad (11)$$

The $\pi/8$ phase gate appropriate to magic state distillation or for increasing (e.g., maximizing) the violation of the CHSH inequality (See Eqs. (2-3)), may be attained by choosing, e.g., $\chi = \pi/2$, $d = a \sinh(1)$.

One possible source of error is an induced splitting between the qubit states due to different rates of tunneling for the two qubit states near the instanton point $\Phi = \pi$, leading to a dynamic phase error in the qubit. Near the instanton point, the wave function is in a superposition between the left and right minima, and the energy of the lower state depends on the probability of the instanton event occurring. If this probability is different for different qubit states, the qubit will split. The probability of the instanton event occurring for each state is proportional to $$P(q) \propto |1 + e^{i(S_+(q) - S_-(q))}| = 1 + (-1)^q e^{-d + i\chi}|. \quad (12)$$

This splitting puts a lower bound on how fast the phase gate should be performed, so as to reduce (e.g., minimize) the accumulation of phase error. Note that if $\chi = \pi/2$, there is no splitting, as the probabilities are equal for the two qubit states. (This is also the condition that maximizes the controlled phase given by Eq. (11)). The dynamic phase error can also be reduced (e.g., minimized) under this condition, an expectation which is borne out by numerical calculation.

In the next section, results of a simulation that supports the analytical instanton analysis of this section are provided.

V. Numerical Simulation

In order to go beyond the instanton approximation detailed in the previous section and Section X, numerical simulations of the Schrodinger equation associated with the Lagrangian (5) were performed. The corresponding Hamiltonian for the system can be written as $$H(\Phi) = \qquad (13)$$
$$E_C \sum_{j=1,2} \left(n_j - \frac{Q_j}{2e}\right)^2 - J_1\cos(\phi_1) - J_2\cos(\phi_2 + \Phi) - J_3\cos(\phi_1 - \phi_2),$$

where $E_C$ is the charging energy of each island (here it is assumed that $C_1 = C_2 = 2e^2/E_C$, $C_3 = 0$ for simplicity) and $n_j = -i\partial_{\phi_j}$ is the charge operator on each superconducting island. The Josephson energy part of the Hamiltonian, which is proportional to $J_{1,2,3}$, is identical to the potential used in the Lagrangian in Eq. (6) up to a gauge transformation. For the numerical calculation, it is convenient to choose a gauge where the Hamiltonian is manifestly $2\pi$-periodic. Technically, there are three different such gauges where the flux enters across each of the junctions. As mentioned at the end of the last section, invariance with respect to the different gauge choices is guaranteed only when the Hamiltonian traces a closed loop where the flux $\Phi$ vanishes at the beginning and the end of the loop.

In order to perform the simulation of the phase gate process, the process of changing the flux $\Phi$ through the loop from 0 to $2\pi$ is divided into a series of small time steps. At each step, the Schrodinger equation $H(\Phi)|\psi(\Phi)\rangle = E(\Phi)|\psi(\Phi)\rangle$ is numerically solved by expanding the wave-function in the eigenbasis $|n_1, n_2\rangle$ of the charge operators. The charging energy is diagonal in this basis and the Josephson energy terms are represented in terms of "hopping" terms such as $|n_1, n_2\rangle\langle n_1+1, n_2|$ etc. In some example embodiments, and with a large enough cutoff ($n_j \in [-15, 15]$ turns out to be sufficient for the example parameters in this discussion), one can diagonalize the Hamiltonian matrix in the charge basis to obtain the ground state wave-function. Since the Hamiltonian is $2\pi$-periodic in the flux, the Berry phase can be computed from the expression $$e^{i\theta_{Berry}} \approx \prod_{n=1}^{N} \left\langle \psi\left(\frac{2\pi n}{N}\right) \middle| \psi\left(\frac{2\pi(n+1)}{N}\right) \right\rangle, \quad (14)$$

where N is the number of steps into which the flux can be discretized. Note that if one chooses N to be too small, the magnitude of the right hand side will be significantly less than unity, while as $N \to \infty$, the above approximation becomes exact. The magnitude of the overlap at each step is thus a helpful diagnostic and should be near unity, serving as a useful check on the accuracy of the simulation.

Figure 6:
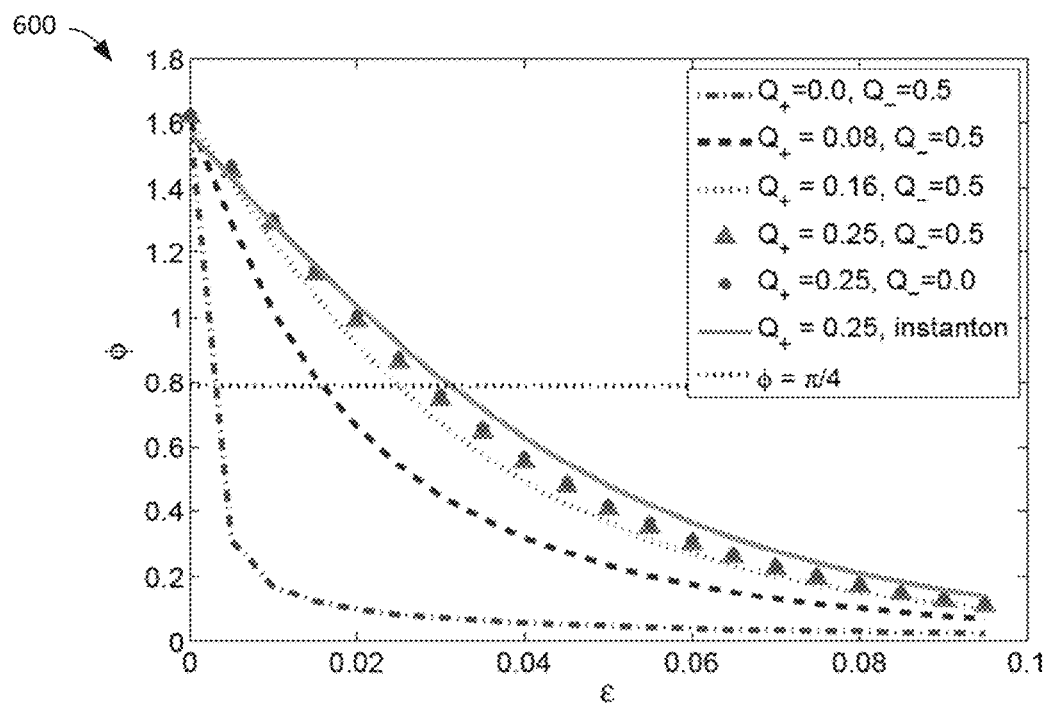
FIG. 6 is a graph showing the relative phase between two quint states acquired through the adiabatic evolution in accordance with an example embodiment of the disclosed technology.

FIG. 6 is a graph 600 showing the relative phase between the two qubit states acquired through the adiabatic evolution. Note that the "magic" phase $\pi/4$ can be attained either by adjusting the gate voltages to change $Q_i$, or by adjusting the imbalance $\in$ in the Josephson couplings. One can compare these results to the prediction of the instanton approximation using the calculated $$d \approx 4\pi \sqrt{\frac{\lambda J}{E_C(1-\epsilon^2)}} \epsilon.$$

In particular, graph 600 shows the relative phase acquired between states of the qubit after the phase gate is enacted, here plotted as a function of the Josephson junction asymmetry $\in$ for a strong junction that is twice as strong as the weak junctions ($\lambda = 2$). The charging energy $E_C$ has been chosen to be 0.4 relative to the scale of Josephson energy $(J_1 + J_2)/2$. The sum and difference of the gate charges $(Q_+ = (Q_1 + Q_2)$ and $Q_- = Q_1 - Q_2)$ are expressed in units of the Cooper pair charge 2e. Note that a relatively small junction asymmetry of $\in \le 0.1$ can tune the gate through a large range of phases.

The qubit state q is encoded in the Hamiltonian through a shift of the gate charge $Q_1 \to Q_1 + q$. The qubit phase generated from the phase gate is calculated by calculating the difference of Berry phases $\theta_{Berry}(q=1) - \theta_{Berry}(q=0)$ acquired as the flux $\Phi$ is changed by $2\pi$. To maintain adiabaticity, the flux is desirably swept at a rate that is small compared to the first excitation gap $E_{gap}$ above the ground state $|\psi(\Phi)\rangle$ of the Hamiltonian in Eq. (13). Such a slow sweep rate leads to a dynamical contribution to the qubit phase that is given by:

$$\theta_{dyn} = \int d\Phi \frac{E(\Phi, q=1) - E(\Phi, q=0)}{\Phi}. \qquad (15)$$

To keep this error small, the sweep rate $\dot{\Phi}$ is desirably kept larger than the energy difference, e.g., $|E(\Phi, q-1)-E(\Phi, q=0)|\gg\dot{\Phi}$. At the same time, adiabaticity desirably involves $\dot{\Phi}\ll E_{gap}$. Thus, the dynamical range (e.g. the range of sweep rates) over which this gate desirably operates, is proportional to $$\zeta = \frac{E_{gap}}{|E(\Phi, q=1) - E(\Phi, q=0)|}. \qquad (16)$$

The inverse of the dynamical range $\zeta^{-1}$ also quantifies the contribution the dynamical phase to the systematic error in the gate.

Figure 7:
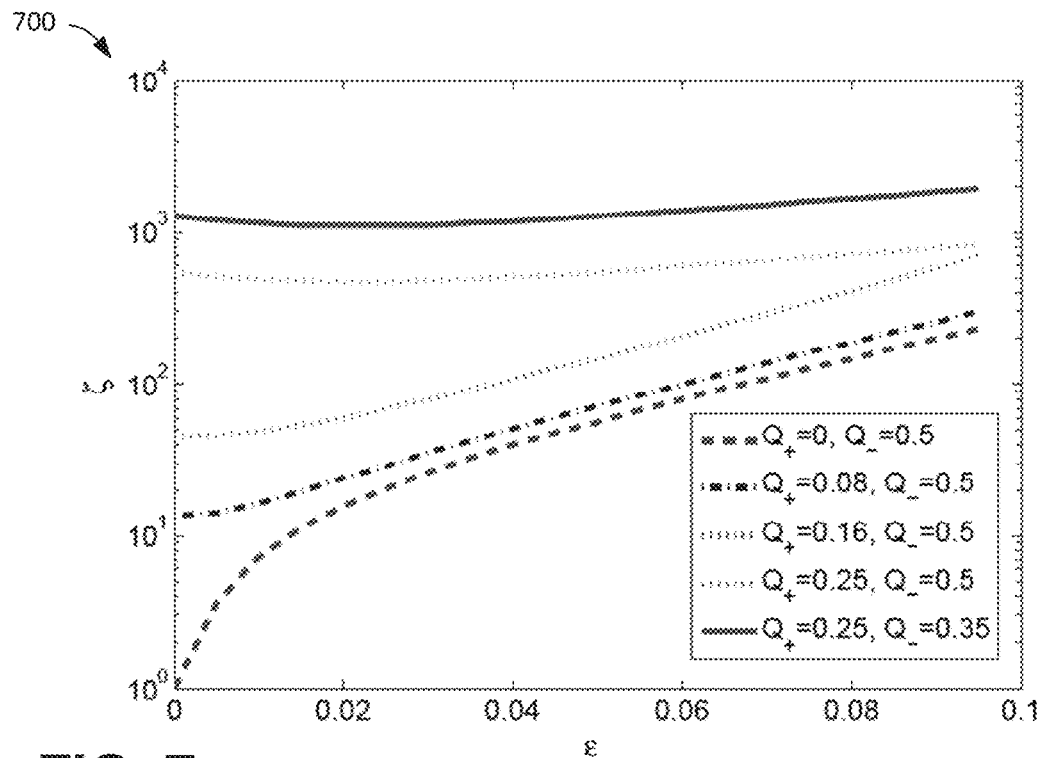
FIG. 7 is a graph showing the dynamical range of the phase gate as a function of the Josephson asymmetry $\epsilon$ for a set of gate charge values $Q_+=(Q_1+Q_2)$ and $Q_-=Q_1-Q_2$ (expressed in units of 2e).

FIG. 7 is a graph 700 showing the dynamical range of the phase gate as a function of the Josephson asymmetry $\in$ for a set of gate charge values $Q_+=(Q_1+Q_2)$ and $Q_-=Q_1-Q_2$ (expressed in units of 2e). In the example graph, the best dynamic range is found for $Q_1+Q_2=\frac{1}{4}$, corresponding to a phase of $\chi=\pi/2$ in Eq. (12). Here the dynamic phase error and the minimal gap differ by three orders of magnitude, allowing the gate to function for a significant range of ramping times.

Figure 8:
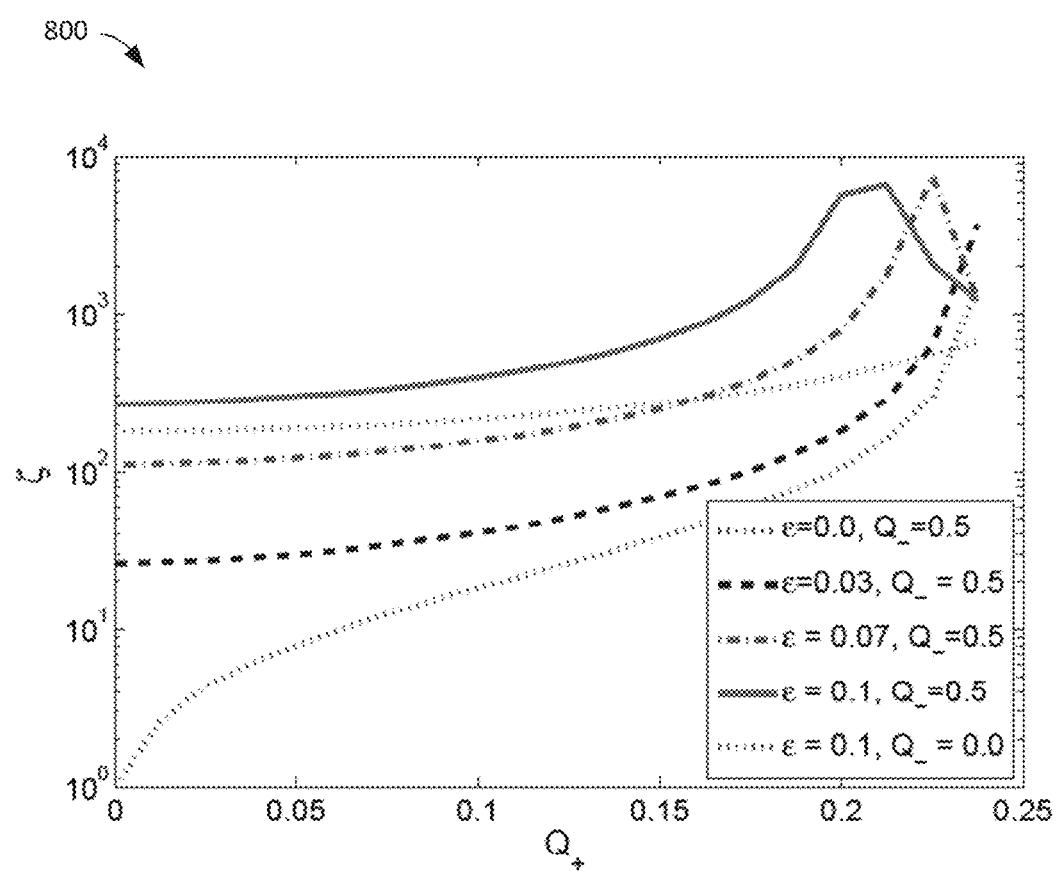
FIG. 8 is a graph showing the dynamical range of the phase gate as a function of the average gate charge $Q_+=(Q_1+Q_2)$ (units of 2e) for a set of values of the Josephson asymmetry $\epsilon$ and $Q_-=Q_1-Q_2$ (expressed in units of 2e).

FIG. 8 is a graph 800 showing the dynamical range of the phase gate as a function of the total gate charge $Q_+=(Q_1+Q_2)$ (units of 2e) for a set of values of the Josephson asymmetry $\in$ and $Q_-=Q_1-Q_2$ (expressed in units of 2e). Note the resonances in dynamic range as the qubit states are tuned to degeneracy.

While at the lowest order instanton approximation, the energy $E(\Phi, q)$ is independent of q, as seen from the numerical results in FIG. 7, higher order instanton corrections lead to energy splittings that are a finite fraction $\zeta^{-1}>0$ of the gap. This is apparent from FIG. 7, since in the ideal case $\zeta$ would be infinite. However, it is also clear that the leading order contribution to $\zeta$ can be reduced (e.g., minimized) by choosing the total gate charge near $Q_1+Q_2=0.25$. This is expected if the major contribution to the qubit splitting comes from the instanton contribution described in Sec. IV. $Q_1+Q_2=0.25$ corresponds to $\chi=\pi/2$ in Eq. (12). FIG. 8 shows that the resonance in the dynamic range (corresponding to the degeneracy point for the qubit states) does not always occur exactly at $Q_1+Q_2=0.25$. Higher order corrections to the instanton calculation will detect the asymmetry in the system, leading to dependence of the resonance $Q_1-Q_2$ and $\in$. Nevertheless, it is evident that a dynamic range of two to three orders of magnitude is achievable over a broad range of parameter space, enabling a rather unconstrained experimental implementation of the phase gate without undue fine tuning. Based on these results, example embodiments of an experimental scheme are introduced to implement embodiments of the disclosed phase gate as well as to verify it using the CHSH-Bell inequality.

Figure 9:
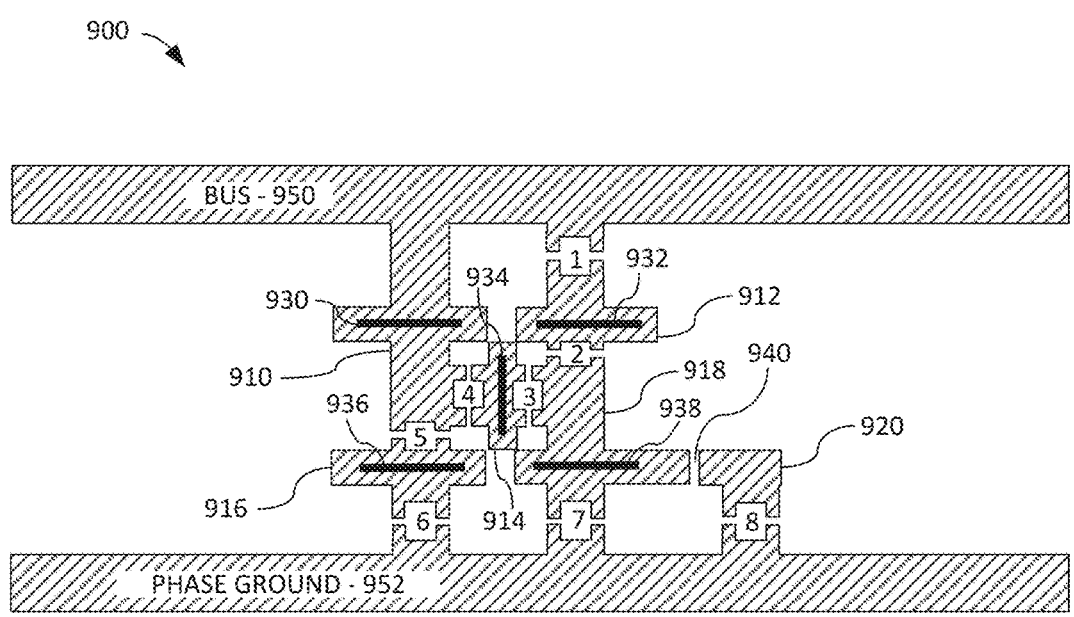
FIG. 9 is a schematic block diagram showing example design for a CHSH measurement system in accordance with the disclosed technology.

FIG. 9 is a schematic block diagram showing an example design for a CHSH measurement system 900. The system 900 comprises several superconducting islands (islands 910, 912, 914, 916, 918, 920, 922) placed within a microwave resonator. Five Majorana nanowires (Majorana nanowires 930, 932, 934, 936, 938) are placed among the islands in such a way as to produce six Majorana zero modes, one at each endpoint along the outer edge, and one at each intersection where three wires meet (see, e.g., T. Hyart et al., Phys. Rev. B 88, 035121 (2013), 1303.4379, for additional detail concerning an example of this type of arrangement).

The top three Majoranas (Majorana nanowires 930, 932, 934) form one qubit, and the bottom three (Majorana nanowires 934, 936, 948) form another qubit. Eight adjustable Josephson junctions (labeled 1-8 in FIG. 9) and one strong fixed junction (junction 940, which can be a strong, fixed Josephson junction) couple the islands to each other and to the Bus 950 (e.g., a superconductive "bus" plate shown at the top of FIG. 9) and Phase Ground 952 (e.g., a superconductive "phase ground" plate shown at the bottom of FIG. 9 and sometimes referred to as the bulk superconductor) of the microwave resonator.

Of these junctions, those labeled 1-6 need only have "on" (strongly coupled) and "off" (very weakly coupled) settings. Junctions 7 and 8 are used to implement an embodiment of the phase gate as described above.

Figure 10:
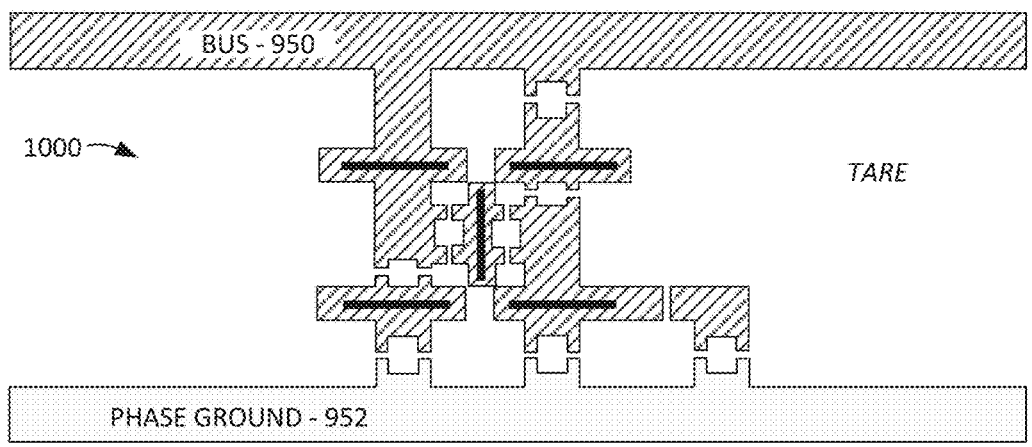
FIG. 10 is a series of block diagrams illustrating an example initialization process for the CHSH measurement system of FIG. 9.
Figure 10:
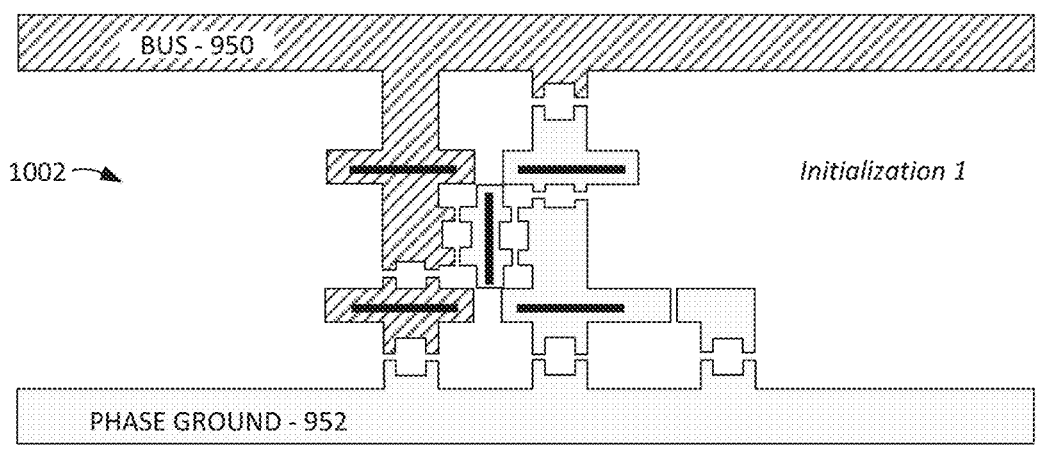
Figure 10:
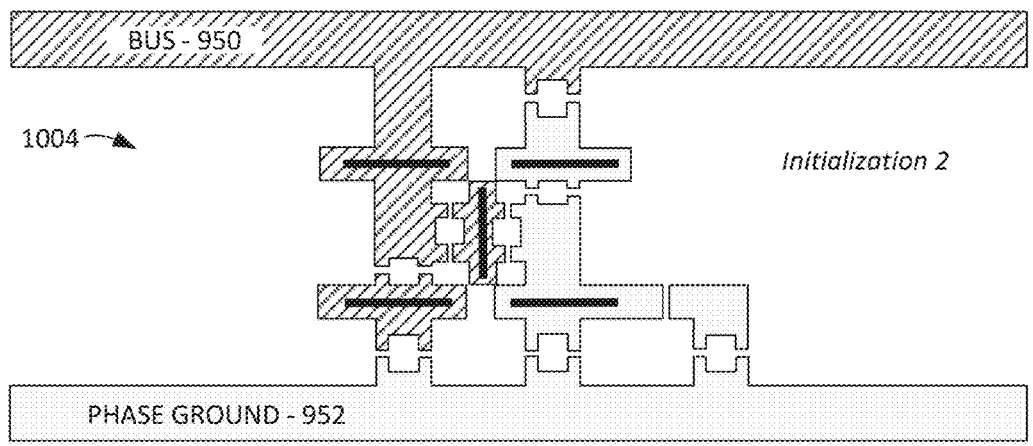

FIG. 10 is a series of block diagrams 1000, 1002, 1004 illustrating an example initialization process for the system shown in FIG. 9. For ease of illustration, the reference numerals and junction numbering from FIG. 9 are omitted, but are understood to have correspondence to the structure shown in FIGS. 10-12. The superconducting islands shown as hatched are strongly Josephson coupled to the Bus 950 whereas the superconducting islands shown with a solid gray fill are strongly Josephson coupled to the Phase Ground 952. The Josephson junctions 1-8 can be controlled to couple (e.g., capacitively couple via the adjustable Josephson junctions 1-8) the islands to each other and to Bus 950 or Phase Ground 952 in any desired configuration. In diagram 1000 (labeled as the "tare" measurement), coupling all islands to the Bus gives a measurement of the overall fermion parity of the system. This allows one to equivalently measure the parity of a qubit by coupling the constituent Majorana modes to the Bus (as in diagram 1002) or the Phase Ground (as in diagram 1004). The two qubits in this device can be put into the superposition $$\frac{1}{\sqrt{2}}(|00\rangle + |11\rangle)$$

by making two measurements; each measurement includes one MZM from each qubit. (Along with the tare measurement of diagram 1000, this will also effectively measure the parity of the central island).

Figure 11:
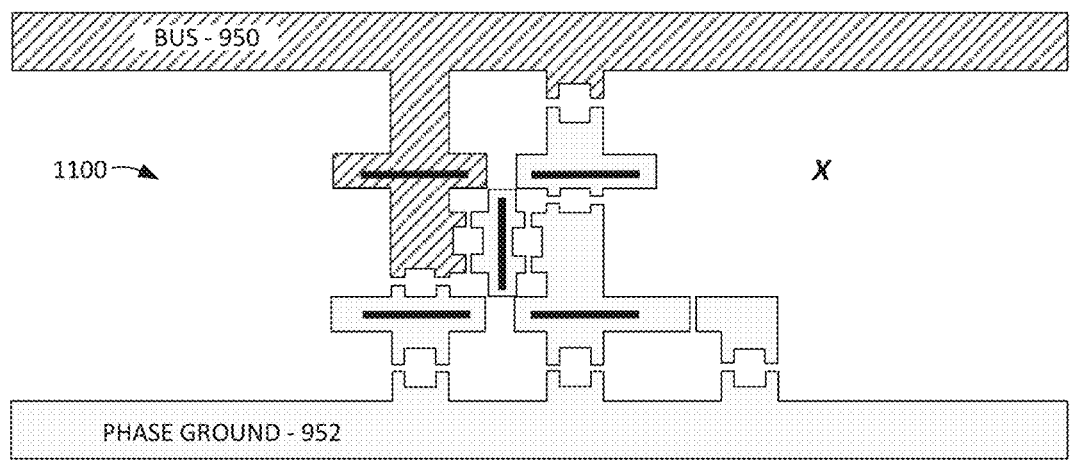
FIG. 11 is a series of block diagrams illustrating measurement of the X projection and Z projection of the upper qubit for the arrangement in FIG. 9.
Figure 11:
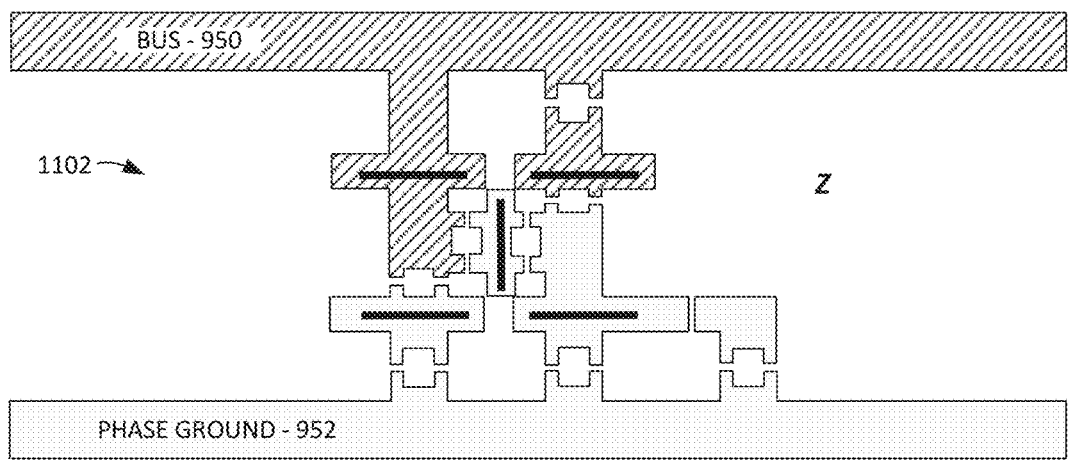

FIG. 11 is a series of block diagrams 1100, 1102 illustrating measurement of the X projection (diagram 1100) and Z projection (diagram 1102) of the upper qubit. The parity of a set of MZMs is measured by Josephson coupling the corresponding superconducting islands strongly to the Bus 950, while coupling the remaining islands to the Phase Ground 952.

Figure 12:
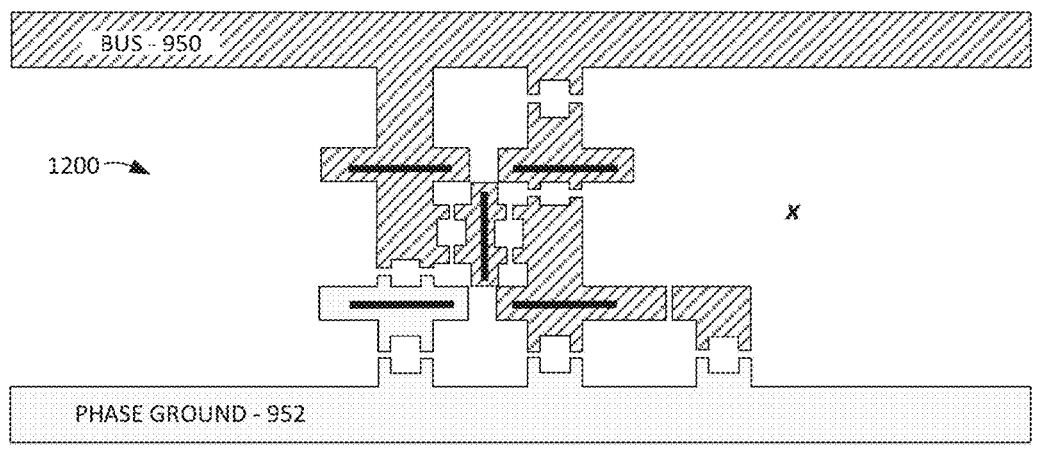
FIG. 12 is a series of block diagrams illustrating measurement of the x projection and z projection of the lower qubit for the arrangement in FIG. 9.
Figure 12:
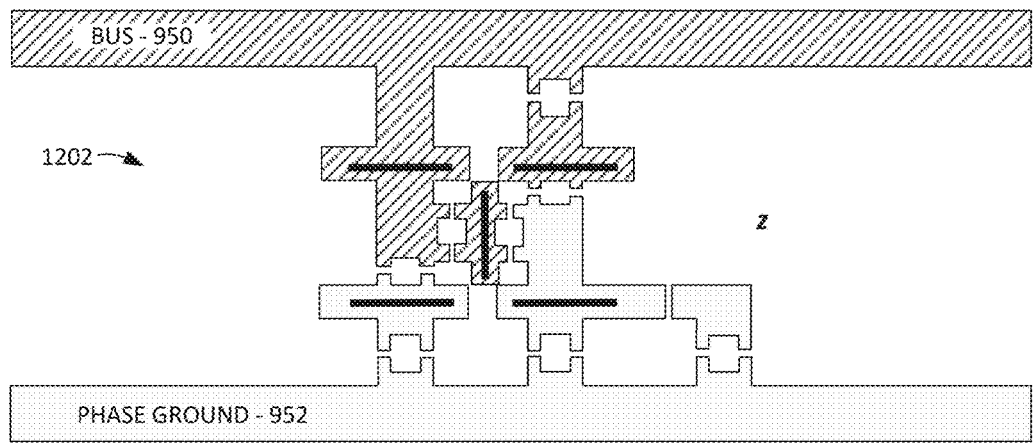

FIG. 12 is a series of block diagrams 1200, 1202 illustrating measurement of the x projection (diagram 1200) and z projection (diagram 1202) of the lower qubit. The tare measurement (see diagram 1000 of FIG. 10) allows one to relate the parity of the section coupled to the Phase Ground 952 to the parity of the section coupled to the Bus.

VI. Example Measurement Scheme and Procedure

In order to implement and test example embodiment of the phase gate shown in FIGS. 10-12 within a physical system, the measurement scheme disclosed by F. Hassler et al. can be used. (See, e.g., F. Hassler et al., New Journal of Physics 13, 095004 (2011), 1105.0315.) In particular, the measurement scheme allows the parity of a pair of Majorana fermions to be read out through a superconducting charge qubit in a transmission line resonator (a "transmon"). (See, e.g., J. Koch et al., Phys. Rev. A 76, 042319 (2007), URL http://link.aps.org/doi/10.1103/PhysRevA.76.042319 for additional details concerning example transmon configurations that can be used with embodiments of the disclosed technology.)

For example, using the arrangement shown in FIG. 9, one can implement the steps of the CHSH-Bell test without ever needing to physically braid any of the Majoranas. This is in line with the so-called "Measurement Only" schemes for topological quantum computation. (See, e.g., P. Bonderson et al., Phys. Rev. Lett. 101, 010501 (2008), arXiv: 0802.0279; and P. Bonderson et al., Annals of Physics 324, 787 (2009), arXiv:0808.1933.) In the illustrated arrangement, each of the islands containing Majorana wires is attached through a series of adjustable Josephson junctions to the larger superconducting region on either the top (Bus 950) or bottom (Phase Ground 952). It is assumed that the coupling between the three Majoranas at each of the trijunctions is strong compared with the charging energy of the islands, and is comparable to the Josephson energy at junction $J_8$ during the performance of the phase gate. Due to this large coupling, the Majorana at the left end of the wire in FIG. 3 is effectively replaced by the zero mode of the trijunction.

Measurement of the resonance frequency of this system when placed within a microwave resonator can resolve whether the total parity of islands connected to the Bus 950 is even or odd. Again, the trijunction coupling is assumed to be large compared with the measurement scale so that the trijunctions are treated as effectively single MZMs. The X and Z components of the upper qubit may be measured by connecting the islands containing the corresponding MZMs strongly to the Bus while connecting all other islands to the Phase Ground, as illustrated in FIG. 11. Similarly, measurements of the lower qubit may be made by connecting the corresponding islands strongly to the Phase Ground, as illustrated in FIG. 12. Because the resonator measurement determines the total parity connected to the Bus, the parity of the ands connected to the Phase Ground may be inferred once the overall parity of the Majorana system is measured. In FIG. 10, this is labeled a "Tare" measurement.

Together, FIGS. 10-12 show the sets of islands coupled to Bus and Phase Ground corresponding to each of the measurements necessary for a test of the CHSH inequality. In most cases, only two settings are needed for the Josephson junctions, strong connection $E_J \gg E_C$ (On), and very weak connection $E_J \ll E_C$ (Off). This switching can be controlled, for example, by threading half a flux between two strong Josephson junctions. The two Josephson junctions in the lower right of FIG. 9, labeled 7 and 8, adjust the phase gate in the manner described above, acting as control parameters for $J_1$ and $J_2$. A strong Josephson coupling $J_3$ is assumed between the two islands in the lower right. While the phase gate is being implemented, Junctions 2 and 3 should be off, allowing flux to pass freely between the island containing the lower right Majorana wire ("y") and the remaining wires. The loop in the lower right now acts as the superconducting loop of FIG. 3 for implementing the phase gate around the y-axis. The remaining Josephson junctions should be on, so that no measurement path is open in the resonator system and all other islands have the superconducting phase inherited from the Phase Ground 952. In this case, the Josephson energy of the lower trijunction acts to renormalize the coupling $J_1$ in the phase gate design of FIG. 3.

FIGS. 10-12 provide the schematic and the protocol for the experimental platform as well as the measurements for the phase gate and CHSH violation disclosed herein. They also provide the tools necessary to conduct an independent test of the fidelity of the phase gate without any alteration of the device, e.g. by measuring x before and after a phase rotation around y.

VII. Qubit Design for Universal Quantum Computation

Figure 13A:
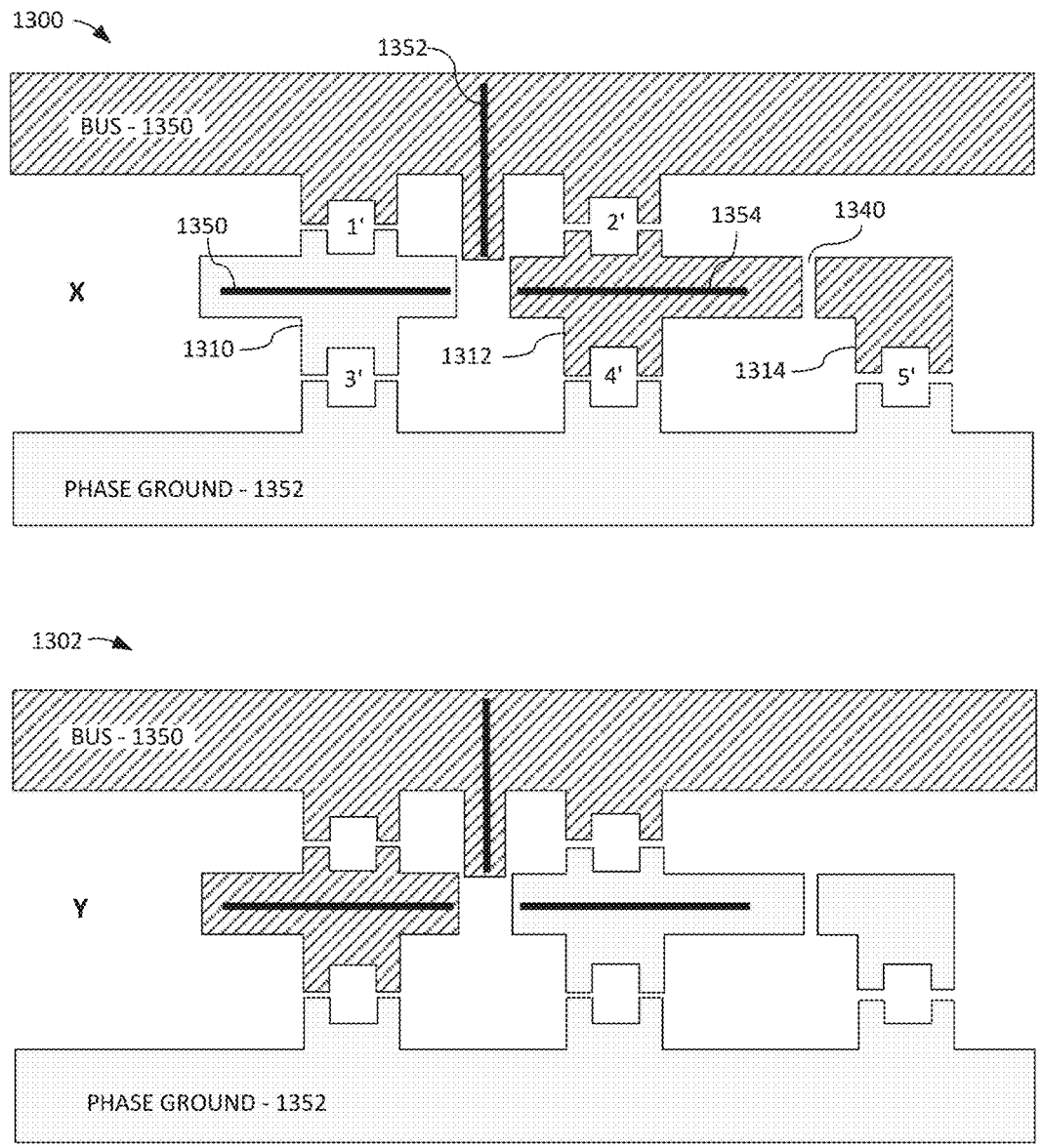
FIGS. 13A-C are schematic block diagrams illustrating how one can construct a set of islands within the resonator system to function as a single qubit, with measurement settings available to measure any Pauli operator $\{I, X, Y, Z\}$, along with a phase gate that operates around the Y axis.
Figure 13B:
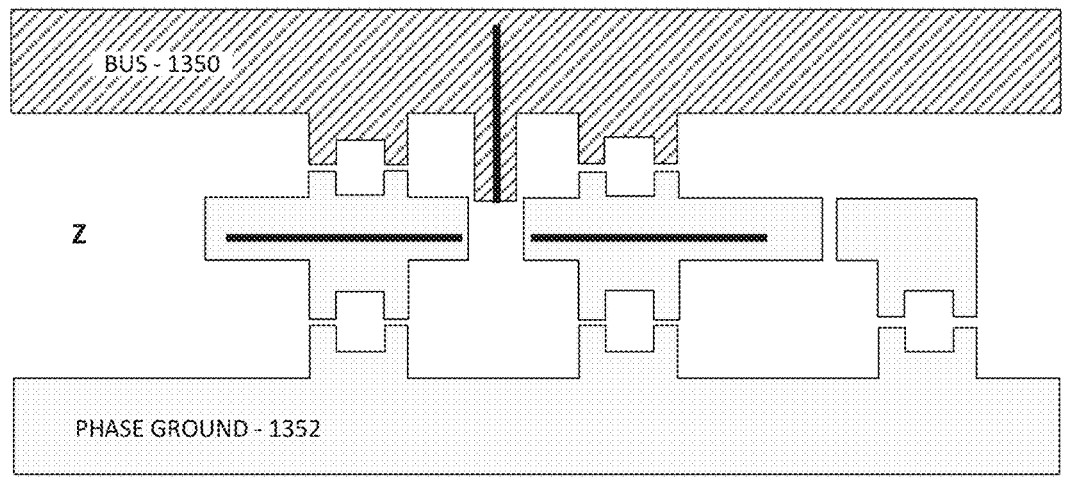
Figure 13B:
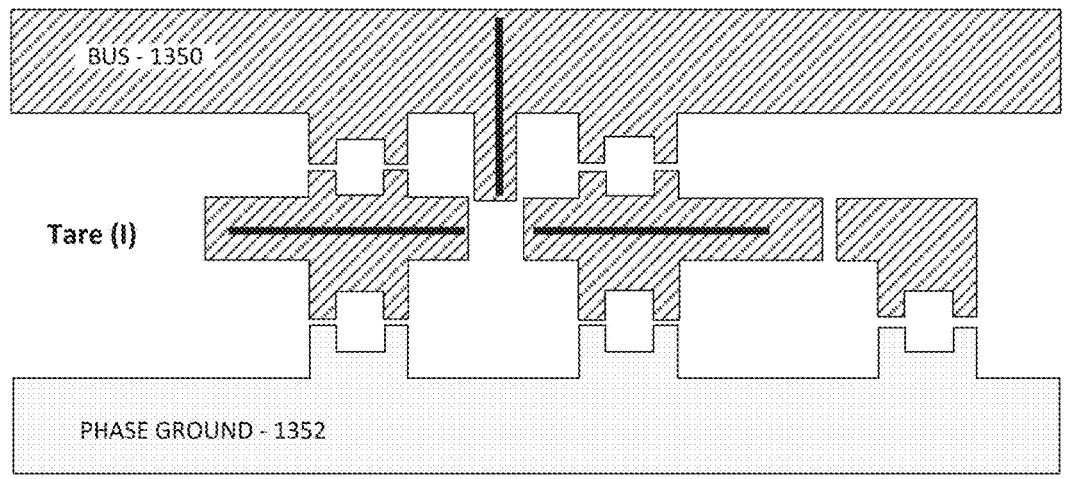
Figure 13C:
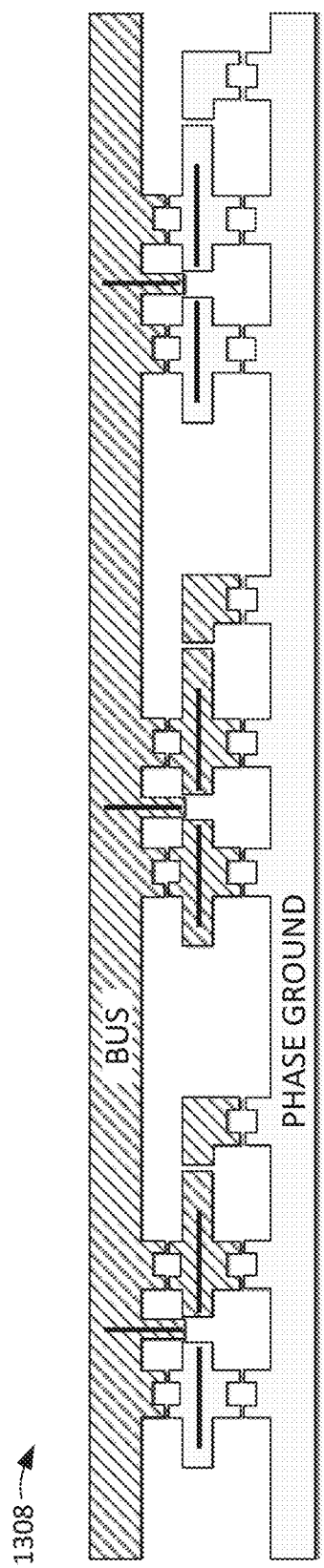

Once Bell violations have been demonstrated, the next step toward universal quantum computation is a scalable qubit register in which all necessary gate operations (e.g., Clifford gates and the π/8 phase gate) could be performed. Example embodiments of the phase gate disclosed herein can be easily worked into such a design, as is demonstrated here in a simplification of the random access Majorana memory (RAMM) introduced in T. Hyart et al., Phys. Rev. 88, 035121 (2013), 1303.4379:

As shown in FIGS. 13A-C, one can construct a set of islands within the resonator system to function as a single qubit, with measurement settings available to measure any Pauli operator {I, X, Y, Z}, along with a phase gate that operates around the Y axis. In more detail, the system 1300 comprises several superconducting islands (islands 1310, 1312, 1314) placed within a microwave resonator. Two Majorana nanowires (Majorana nanowires 1330, 1332) and a further Majorana wire (Majorana nanowire 1334) connected to the Bus 1350 are placed in the system 1300 in such a way as to produce four Majorana zero modes: one at each endpoint along the outer edge, and one at each intersection where three wires meet. These Majorana modes (originating from Majorana nanowires 1350, 1352, 1354) form one qubit. Five adjustable Josephson junctions (labeled 1' to 5' in FIG. 13) and one strong fixed junction (junction 1340, which can be a strong, fixed Josephson junction) couple the islands to each other and to the Bus 1350 (e.g., a superconductive "bus" plate shown at the top of FIG. 13) and/or Phase Ground 1352 (e.g., a superconductive "phase ground" plate shown at the bottom of FIG. 13 and sometimes referred to as the bulk superconductor) of the microwave resonator. Of these junctions, those labeled 1'-3' need only have "on" (strongly coupled) and "off" (very weakly coupled) settings. Junctions 4' and 5' are used to implement an embodiment of the phase gate as described above. For ease of illustration, the reference numerals and junction numbering from diagram 1300 in FIG. 13 are omitted in diagrams 1302-1308, but are understood to have correspondence to the structure shown in diagram 1300 of FIG. 13A.

Furthermore, by coupling several qubits to the same register, one can perform Pauli measurements (e.g., any Pauli measurement) on the qubits. The set of Clifford gates may be efficiently constructed using Pauli measurements. (See, e.g., P. Bonderson et al., Phys. Rev. Lett. 101, 010501 (2008), arXiv:0802.0279, and P. Bonderson et al., Annals of Physics 324, 787 (2009), arXiv:0808.1933, for additional details.) Combined with the phase gates available on each qubit and the distillation of magic states using these phase gates, this example design provides the necessary components for universal quantum computation. One notable feature of this example design is the elimination of a need for nanowire "networks." For instance, only a single (and separated) crossing of Majorana wires is used for each qubit, significantly simplifying the fabrication of the Majorana register.

The method outlined in FIGS. 13A-C, which combines magic state distillation and measurement-only techniques in the context of the example phase gate disclosed herein, represents a practical approach for carrying out universal quantum computation using nanowire MZMs.

VIII. Additional Observations

The real world function of the phase gate, as well as its quantum entanglement properties (beyond the Gottesmann-Knill constraint of pure Clifford operations) can be diagnosed through Bell measurements. These tests of the CHSH inequality are no more daunting than tests of braiding, yet are better targeted toward the eventual implementation of quantum information processing in Majorana-based platforms. In fact, it has been shown that any operation capable of producing a violation of the CHSH inequality, when combined with Clifford operations, is sufficient for universal quantum computation. By contrast, the protocols described herein with reference to FIGS. 10-13 are not necessarily tests of quantum nonlocality itself, as it is unlikely that the qubits in the example configurations will be space-like separated. In any case, it is clear that nonlocality is not sufficient for universal quantum computation, as it may be achieved in Ising anyons through braiding alone (a system that does not even suffice for universal classical computation).

In certain embodiment, the CHSH inequality is used to experimentally characterize the example phase gate disclosed herein, a realization that benefits from a relative immunity to timing errors and that can be combined with measurement operations in a unified architecture.

IX. General Embodiments

Figure 14:
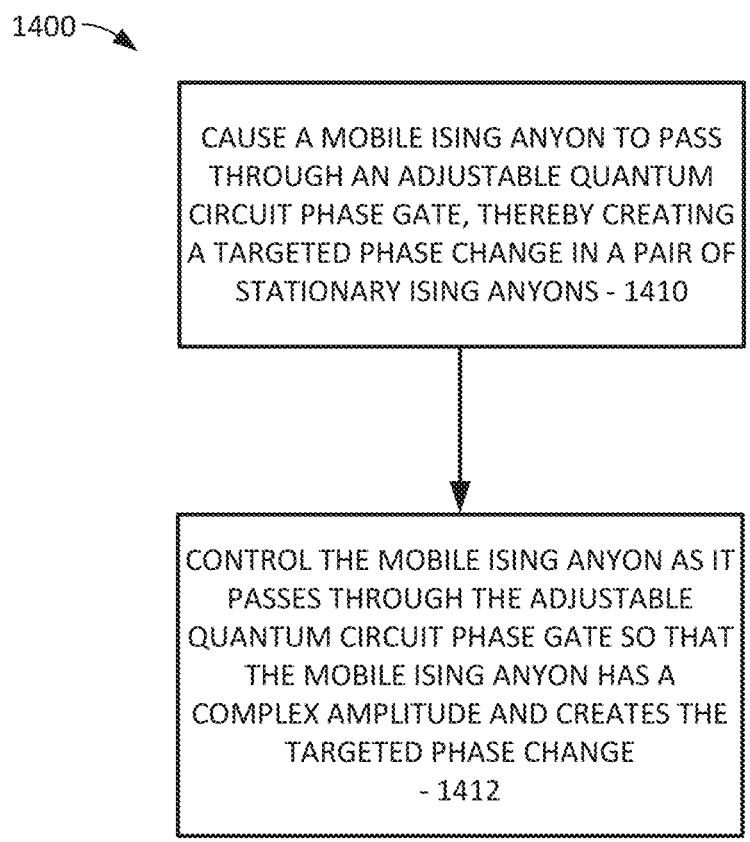
FIG. 14 is a flow chart illustrating an example process for operating a quantum circuit in accordance with the embodiments introduced above.

FIG. 14 is a flow chart 1400 illustrating an example process for operating an adjustable phase gate in a quantum circuit. Here, the adjustable phase gate comprises a stationary pair of Ising anyons. The particular example shown in FIG. 14 should not be construed as limiting, as the disclosed method acts can be performed alone, in different orders, or at least partially simultaneously with one another. Further, any of the disclosed methods or method acts can be performed with any other methods or method acts disclosed herein.

At 1410, a mobile Ising anyon is passed through (e.g., caused to pass through) the adjustable phase gate, thereby creating a targeted phase change in the stationary pair of Ising anyons. For instance, any of the embodiments described with respect to FIGS. 2, 3, and 9-13 can be used to create such passage.

At 1412, the mobile Ising anyon is controlled as the mobile Ising anyon passes through the adjustable phase gate so that the mobile Ising anyon has a complex amplitude during passage. In particular implementations, the controlling is performed such that the targeted phase change experienced by the stationary pair of Ising anyons is between 0 and $\pi$ or 0 and $-\pi$. In particular implementations, the controlling can be performed by making one or more adjustments to the adjustable variables of the phase gate (e.g., as discussed above with reference to FIG. 3). For instance, the controlling can comprise performing one or more of: (a) adjusting a gate voltage of one or more gates capacitively coupled to one or more superconducting islands that form the adjustable phase gate, (b) adjusting a capacitance of one or more of the superconducting islands; or (c) adjusting a strength of at least one Josephson junction relative to at least one other Josephson junction, the Josephson junctions connecting two or more of the superconducting islands to one another.

In certain example embodiments, the method further comprises, in a first operational stage, altering a magnetic flux through the adjustable phase gate in a first direction, the first direction comprising either increasing the magnetic flux or decreasing the magnetic flux; and, in a second operational stage, altering the magnetic flux through the adjustable phase gate a second direction that is opposite of the first direction. In some examples, during either or both operational stages, the method can comprise adjusting a strength of a first Josephson junction at a first end of a superconducting region in the adjustable phase gate; and, during either or both operational stages, adjusting a strength of a second Josephson junction at a second end of the superconducting region in the adjustable phase gate, wherein the strengths of the first and second Josephson junctions are selected to create a relative difference that produces the targeted phase change in the Ising pair.

In certain implementations, the adjustable phase gate comprises a plurality of superconducting regions arranged to form a superconducting loop, adjacent ones of the superconducting regions are connected to one another via respective Josephson junctions, and one of the superconducting regions comprises a Majorana wire located on the one of the superconducting regions. In some implementations, the adjustable phase gate is implemented in a transmission line resonator comprising three Majorana wires arranged to form a qubit between a bus and a phase ground of the transmission line resonator. In certain implementations, the method further comprises measuring one or more Pauli operators of the qubit by selectively controlling: (a) Josephson couplings between a first superconducting region (e.g., island 1312) on which a first Majorana wire is located and a bus and phase ground; and (b) Josephson couplings between a second superconducting region (e.g., island 1310) on which a second Majorana wire is located and the bus and the phase ground. In some example embodiments, the superconducting loop that is desirable for the phase gate is formed by the second superconducting region, the phase ground, and a third superconducting region (e.g., island 1314) containing no Majorana wire.

Figure 15:
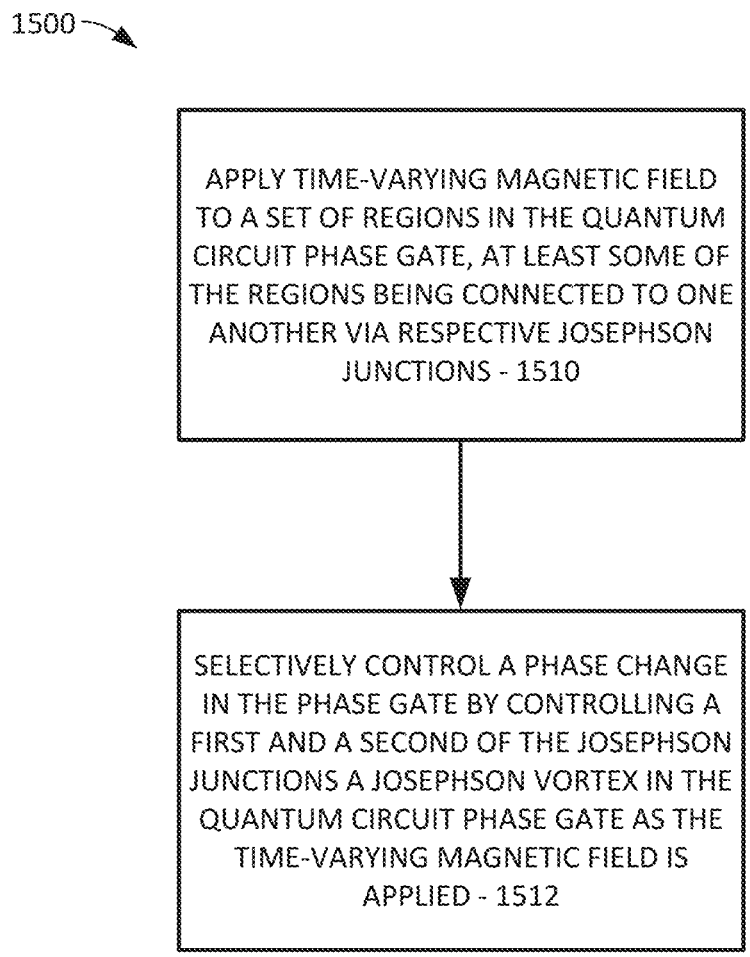
FIG. 15 is a flow chart illustrating another example process for operating a quantum circuit in accordance with the embodiments introduced above.

FIG. 15 is a flow chart 1500 illustrating an example process for operating a quantum circuit phase gate. The particular example shown in FIG. 15 should not be construed as limiting, as the disclosed method acts can be performed alone, in different orders, or at least partially simultaneously with one another. Further, any of the disclosed methods or method acts can be performed with any other methods or method acts disclosed herein.

At 1510, a time-varying magnetic field is applied to a set of regions in the quantum circuit phase gate, at least some of the regions being connected to one another via respective Josephson junctions.

At 1512, a first of the Josephson junctions and a second of the Josephson junctions are controlled to create a Josephson vortex in the quantum circuit phase gate as the time-varying magnetic field is applied.

In one embodiment, the regions are superconducting regions that together form a superconducting loop (e.g., regions 320, 322, 330 as in FIG. 3; regions 938, 920, 952 as in FIG. 9; or 1312, 1314, 1352 as in FIG. 13). In some embodiments, the Josephson vortex produces a phase change to a qubit stored in a qubit register formed with the quantum circuit phase gate. In further implementations, the phase change is selectively variable between 0 and π or 0 and −π.

In other embodiments, a quantum circuit phase gate is disclosed herein. The quantum circuit phase gate of such embodiments can comprise, for example: a plurality of superconducting components arranged in a ring to form a superconducting loop, the adjacent superconducting components being connected to each other via Josephson junctions; a Majorana wire located on a respective one of the superconducting components; and a magnetic field generator configured to apply a variable magnetic field to the superconducting loop formed by the ring of superconductive components.

In particular implementations, the magnetic field generator and the capacitance of one or more of the superconducting components are controllable to draw a Josephson vortex into the superconducting loop. In some implementations (as in FIGS. 3, 9, and 13, for example), the superconducting components comprise first and second superconducting islands connected to a bulk superconductor. Further, in some examples, the first superconducting island is connected to the bulk superconductor via a first controllable Josephson junction, the second superconducting island is connected to the bulk superconductor via a second controllable Josephson junction, and the first superconducting island is connected to the second superconducting island via a third Josephson junction. In particular implementations, only the first and second Josephson junctions are controllable (e.g., as shown in FIGS. 3, 9, and 13).

In some embodiments, the phase gate is part of a qubit register in a microwave resonator system. Further, in such embodiments, the Majorana can be a first Majorana wire, and the plurality of superconducting components arranged in a ring can comprise: (a) a first superconducting component coupled to the phase ground via a first controllable Josephson junction and coupled to the bus via a second controllable Josephson junction, the first Majorana wire being located on the first superconducting component; and (b) a second superconducting component coupled to the phase ground via a third controllable Josephson junction and coupled to the first superconducting component via a fixed Josephson junction, the second superconducting component being disconnected from the bus. In further implementations (e.g., as shown in FIG. 13), the microwave resonator can comprise a third superconducting component coupled to the phase ground via a fifth controllable Josephson junction and to the bus via a sixth controllable Josephson junction. The resonator can further comprise a second Majorana wire located on the third superconducting component and a third Majorana wire located on a superconducting component connected to the bus, where the first, second, and third Majorana wires are positioned to create the qubit register with no braiding mechanism.

Further embodiments comprise a Clauser-Horne-Shimony-Holt (CHSH) inequality or Bell inequality measurement system comprising any of the phase gates as described herein.

X. Example Instanton Calculation

When $\Phi=\pi$, the degenerate minima of the potential V from Eq. 6 occur at $$\cos(\delta\phi) = \frac{J_1^2 + J_2^2}{2J_1 J_2} - \frac{J_1 J_2}{2J_3^2} \quad (17)$$

$$\tan(\bar{\phi}) = \frac{J_1 - J_2}{J_1 + J_2}\cot(\delta\phi/2).$$

The value of the potential at these minima is $$V_{min} = J_3 \frac{J_1^2 + J_2^2}{2J_1 J_2} - \frac{J_1 J_2}{2J_3}. \quad (18)$$

The classical equations of motion for the Lagrangian (5) (with $\Phi=\pi$) may be derived and rewritten as $$\frac{\Phi_0^2}{8\pi^2 J}\hat{C}\begin{pmatrix}\ddot{\bar{\phi}}\\ \ddot{\delta\phi}\end{pmatrix} = \begin{pmatrix}1 & \epsilon\\ \epsilon & 1\end{pmatrix}\begin{pmatrix}-\sin\bar{\phi}\sin\frac{\delta\phi}{2}\\ \cos\bar{\phi}\cos\frac{\delta\phi}{2}\end{pmatrix} - \begin{pmatrix}0\\ \lambda\sin(\delta\phi)\end{pmatrix}, \quad (19)$$

where $J_1 = (1+\epsilon)J$, $J_2 = (1-\epsilon)J$, $J_3 = \lambda J$ $$\hat{C} = \begin{pmatrix}\bar{C} & \tilde{C}\\ \tilde{C} & C_\delta\end{pmatrix}, \text{ and} \quad (20)$$

$\bar{C} = C_1 + C_2 - 2C_3$
$\tilde{C} = C_1 - C_2$
$C_\delta = C_1 + C_2 + 2C_3.$ One can analyze these equations using an instanton approximation in the limit $$\eta = \frac{1-\epsilon^2}{2\lambda} \ll 1.$$

Note that the condition (8) additionally requires that $\epsilon \ll \eta$.

In this case, one can vastly simplify the equations of motion by expanding in orders of $\eta$:

$$\delta\phi = 2\eta\cos\bar{\phi} - \frac{\Phi_0^2 \eta \tilde{C}}{4\pi^2 J}\ddot{\bar{\phi}} + O(\eta^3). \quad (21)$$

To bound the order of the corrections, one can use the fact that the first equation of motion implies that time derivatives scale as $\sqrt{\eta}$ because the $\bar{\phi}$ excursion for the instanton is not small. Next, one can make use of energy conservation to gain the first integral of motion:

$$H = 0 = \frac{\Phi_0^2}{8\pi^2 \bar{C}}(\bar{C} - \eta\tilde{C}\sin\bar{\phi})^2 \dot{\bar{\phi}}^2 + J\eta\left(\sin\bar{\phi} - \frac{\epsilon}{\eta}\right)^2 + O(\eta^3). \quad (22)$$

Note that for this equation to have a non-trivial solution for real $\phi_t$, one can propagate the system in imaginary time (hence the instanton solution). The total instanton action is therefore $$S = \int_{-i\infty}^{i\infty} dt \sqrt{\frac{\Phi_0^2 J\eta}{2\pi^2 \overline{C}} i(\overline{C} - \eta \tilde{C} \sin\overline{\phi})\left(\sin\overline{\phi} - \frac{\epsilon}{\eta}\right)} + \quad (23)$$

$$\frac{\Phi_0}{2\pi}(Q_1 + Q_2 + eq)\dot{\overline{\phi}} + \frac{\Phi_0}{4\pi}(Q_1 - Q_2 + eq)\delta\dot{\phi} + O(\eta^3).$$

The last term provides a constant phase shift that is exactly canceled by the adiabatic phase coming from the change of the potential minimum for $\delta\phi$ as $\Phi$ is cycled from 0 to $2\pi$ (unlike $\overline{\phi}$, $\delta\phi$ returns to zero after a full cycle). Likewise, one may ignore terms that are independent of the direction that $\overline{\phi}$ travels. In fact, of primary interest is the difference between the action of the paths with positive and negative $\overline{\phi}$.

The effective phase gate after adiabatic evolution of $\Phi$ is given by $$U(q) = \exp(i \operatorname{Arg}(1 + e^{i(S_+(q) - S_-(q))})), \quad (24)$$

where q is the qubit state and we can now calculate $$S_+(q) - S_-(q) = \quad (25)$$

$$-i\Phi_0 \sqrt{\frac{J\eta}{2\overline{C}}\left(2\overline{C}\frac{\epsilon}{\eta} + \eta\tilde{C}\right)} + O(\eta^{5/2}) + \Phi_0(Q_1 + Q_2) + \pi q.$$

XI. Concluding Remarks

Having illustrated and described the principles of the disclosed technology, it will be apparent to those skilled in the art that the disclosed embodiments can be modified in arrangement and detail without departing from such principles. In view of the many possible embodiments to which the principles of the disclosed invention may be applied, it should be recognized that the illustrated embodiments are only preferred examples of the invention and should not be taken as limiting the scope of the invention.

What is claimed is:

1. A quantum circuit phase gate, comprising:
   a plurality of superconducting components arranged in a ring to form a superconducting loop, wherein adjacent superconducting components are connected to each other via Josephson junctions;
   a Majorana wire located on a respective one of the superconducting components; and
   a magnetic field generator configured to apply a variable magnetic field to the superconducting loop formed by the ring of superconductive components.

2. The quantum circuit phase gate of claim 1, wherein the magnetic field generator and the capacitance of one or more of the superconducting components are controllable to draw a Josephson vortex into the superconducting loop.

3. The quantum circuit phase gate of claim 1, wherein the superconducting components comprise first and second superconducting islands connected to a bulk superconductor.

4. The quantum circuit phase gate of claim 3, wherein the first superconducting island is connected to the bulk superconductor via a first controllable Josephson junction, the second superconducting island is connected to the bulk superconductor via a second controllable Josephson junction, and the first superconducting island is connected to the second superconducting island via a third Josephson junction.

5. The quantum circuit phase gate of claim 4, wherein only the first and second Josephson junctions are controllable.

6. A microwave resonator system configured to implement a qubit register between a bus and a phase ground, the qubit register comprising the phase gate of claim 1.

7. The microwave resonator of claim 6, wherein the Majorana wire is a first Majorana wire, and wherein the plurality of superconducting components arranged in a ring comprises: a first superconducting component coupled to the phase ground via a first controllable Josephson junction and coupled to the bus via a second controllable Josephson junction, the first Majorana wire being located on the first superconducting component; and a second superconducting component coupled to the phase ground via a third controllable Josephson junction and coupled to the first superconducting component via a fixed Josephson junction, the second superconducting component being disconnected from the bus.

8. The microwave resonator of claim 7, further comprising: a third superconducting component coupled to the phase ground via a fifth controllable Josephson junction and to the bus via a sixth controllable Josephson junction; a second Majorana wire located on the third superconducting component; a third Majorana wire located on a superconducting component connected to the bus, wherein the first, second, and third Majorana wires are positioned to create the qubit register with no braiding mechanism.

9. A Clauser-Home-Shimony-Holt (CHSH) inequality or Bell inequality measurement system comprising the phase gate of claim 1.

10. A method of operating a quantum circuit phase gate, comprising:
    applying a time-varying magnetic field to a set of regions in the quantum circuit phase gate, at least some of the regions being connected to one another via respective Josephson junctions; and
    controlling a first of the Josephson junctions and a second of the Josephson junctions to create a Josephson vortex in the quantum circuit phase gate as the time-varying magnetic field is applied.

11. The method of claim 10, wherein the regions are superconducting regions, and wherein the regions form a superconducting loop.

12. The method of claim 10, wherein the Josephson vortex produces a phase change to a qubit stored in a qubit register formed with the quantum circuit phase gate.

13. The method of claim 12, further comprising selectively varying the phase change between 0 and $\pi$ or 0 and $-\pi$.

* * * * *